United States Patent
Oh et al.

(10) Patent No.: US 9,899,473 B2
(45) Date of Patent: Feb. 20, 2018

(54) METHOD OF FORMING NANOSTRUCTURE, METHOD OF MANUFACTURING SEMICONDUCTOR DEVICE USING THE SAME, AND SEMICONDUCTOR DEVICE INCLUDING NANOSTRUCTURE

(71) Applicant: SAMSUNG ELECTRONICS CO., LTD., Suwon-si (KR)

(72) Inventors: Youngtek Oh, Yongin-si (KR); Hyeokshin Kwon, Seongnam-si (KR); Hwansoo Suh, Gunpo-si (KR); Insu Jeon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/261,229

(22) Filed: Sep. 9, 2016

(65) Prior Publication Data

US 2017/0077226 A1     Mar. 16, 2017

(30) Foreign Application Priority Data

Sep. 10, 2015 (KR) .................. 10-2015-0128571

(51) Int. Cl.
*H01L 21/00* (2006.01)
*H01L 29/00* (2006.01)
(Continued)

(52) U.S. Cl.
CPC .......... *H01L 29/0673* (2013.01); *B82Y 10/00* (2013.01); *B82Y 40/00* (2013.01);
(Continued)

(58) Field of Classification Search
CPC .......... H01L 21/02532; H01L 21/0254; H01L 21/02603; H01L 29/0673; H01L 29/78;
(Continued)

(56) References Cited

U.S. PATENT DOCUMENTS

| 1,745,175 A | 1/1930 | Lilienfeld |
| 1,877,140 A | 9/1932 | Lilienfeld |

(Continued)

FOREIGN PATENT DOCUMENTS

| KR | 10-2006-0094862 A | 8/2006 |
| KR | 10-2008-0114023 A | 12/2008 |

(Continued)

OTHER PUBLICATIONS

Li, et al., "Low-Temperature Growth of Graphene by Chemical Vapor Deposition Using Solid and Liquid Carbon Sources" Apr. 26, 2011, ACS Nano, vol. 5 Issue No. 4, pp. 3,385-3,390, XP 055100300.

(Continued)

*Primary Examiner* — Nikolay Yushin
(74) *Attorney, Agent, or Firm* — Sughrue Mion, PLLC

(57) ABSTRACT

Provided are methods of forming nanostructures, methods of manufacturing semiconductor devices using the same, and semiconductor devices including nanostructures. A method of forming a nanostructure may include forming an insulating layer and forming a nanostructure on the insulating layer. The insulating layer may have a crystal structure. The insulating layer may include an insulating two-dimensional (2D) material. The insulating 2D material may include a hexagonal boron nitride (h-BN). The insulating layer may be formed on a catalyst metal layer. The nanostructure may include at least one of silicon (Si), germanium (Ge), and SiGe. The nanostructure may include at least one nanowire.

33 Claims, 25 Drawing Sheets
(5 of 25 Drawing Sheet(s) Filed in Color)

(51) Int. Cl.
*H01L 29/06* (2006.01)
*B82Y 10/00* (2011.01)
*B82Y 40/00* (2011.01)
*H01L 29/66* (2006.01)
*H01L 29/775* (2006.01)
*H01L 29/16* (2006.01)
*H01L 21/02* (2006.01)
*H01L 29/78* (2006.01)
*H01L 29/861* (2006.01)

(52) U.S. Cl.
CPC .... *H01L 21/0254* (2013.01); *H01L 21/02425* (2013.01); *H01L 21/02444* (2013.01); *H01L 21/02458* (2013.01); *H01L 21/02488* (2013.01); *H01L 21/02499* (2013.01); *H01L 21/02532* (2013.01); *H01L 21/02601* (2013.01); *H01L 21/02603* (2013.01); *H01L 21/02631* (2013.01); *H01L 21/02639* (2013.01); *H01L 29/16* (2013.01); *H01L 29/66439* (2013.01); *H01L 29/775* (2013.01); *H01L 29/78* (2013.01); *H01L 29/861* (2013.01)

(58) Field of Classification Search
CPC ....... H01L 29/861; B82Y 10/00; B82Y 40/00; B82Y 30/00
See application file for complete search history.

(56) References Cited

U.S. PATENT DOCUMENTS

| | | | |
|---|---|---|---|
| 1,900,018 A | 3/1933 | Lilienfeld | |
| 3,206,670 A | 9/1965 | Atalla | |
| 8,043,942 B2* | 10/2011 | Lee | B82Y 20/00 257/13 |
| 8,071,972 B2 | 12/2011 | Lu et al. | |
| 8,159,037 B2* | 4/2012 | Woo | B82Y 10/00 117/951 |
| 8,440,467 B2 | 5/2013 | Tour et al. | |
| 9,190,509 B2* | 11/2015 | Nayfeh | H01L 29/7789 |
| 2009/0142558 A1 | 6/2009 | Jiao et al. | |
| 2009/0294759 A1* | 12/2009 | Woo | B82Y 10/00 257/29 |
| 2010/0127241 A1 | 5/2010 | Gruner et al. | |
| 2010/0327258 A1* | 12/2010 | Lee | H01L 21/0237 257/14 |
| 2014/0008616 A1 | 1/2014 | Geim et al. | |
| 2014/0103296 A1 | 4/2014 | Yu et al. | |
| 2014/0252415 A1* | 9/2014 | Nayfeh | H01L 29/7789 257/194 |
| 2016/0035838 A1 | 2/2016 | Yi et al. | |

FOREIGN PATENT DOCUMENTS

| | | |
|---|---|---|
| KR | 10-2009-0062564 A | 6/2009 |
| KR | 10-2011-0076465 A | 7/2011 |
| KR | 10-2011-0101287 A | 9/2011 |
| KR | 10-2013-0024646 A | 3/2013 |
| KR | 10-20130101724 A | 9/2013 |
| WO | 2014/126300 A1 | 8/2014 |

OTHER PUBLICATIONS

Communication dated Feb. 13, 2017, issued by the European Patent Office in counterpart European Patent Application No. 16188135.4.
Wang et al., "A Plateform for Large-Scale Graphene Electronics—CVD Growth of Single-Layer Graphene on CVD-Grown Hexagonal Boron Nitride", Advanced Materials, Apr. 10, 2013, vol. 25, pp. 2746-2752.

* cited by examiner

METHOD OF FORMING NANOSTRUCTURE, METHOD OF MANUFACTURING SEMICONDUCTOR DEVICE USING THE SAME, AND SEMICONDUCTOR DEVICE INCLUDING NANOSTRUCTURE

CROSS-REFERENCE TO RELATED APPLICATION

This application claims priority from Korean Patent Application No. 10-2015-0128571, filed on Sep. 10, 2015 in the Korean Intellectual Property Office, the disclosure of which is herein incorporated by reference in its entirety.

BACKGROUND

1. Field

The present disclosure relates to methods of forming nanostructures, methods of manufacturing semiconductor devices using the same, and semiconductor devices including nanostructures.

2. Description of the Related Art

Semiconductor devices, such as transistors and diodes, are widely used for various purposes in various electronic device fields. For example, transistors are used as switching devices or driving devices in display devices, memory devices, and logic circuits, and are used as basic components of various other circuits.

Most of the currently-commercialized transistors are silicon (Si)-based metal oxide semiconductor field effect transistors (MOSFETs). In general, a MOSFET may be manufactured by forming a gate oxide, such as a silicon oxide, on a channel region (semiconductor) of a silicon substrate and then forming a metal gate or a polysilicon gate thereon. However, due to manufacturing process limits and/or property limits of existing MOSFETs, research into and development of next-generation materials/devices capable of overcoming these limits are required.

SUMMARY

One or more exemplary embodiments provide methods of growing nanostructures on an insulating layer having a crystal structure.

One or more exemplary embodiments also provide methods of growing nanostructures on a two-dimensional (2D) material.

One or more exemplary embodiments also provide methods of manufacturing semiconductor devices by using the nanostructure growing methods.

One or more exemplary embodiments also provide various semiconductor devices including nanostructures.

According to an aspect of an exemplary embodiment, a method of forming a nanostructure includes: forming an insulating layer having a crystal structure and growing at least one semiconductor nanostructure on the insulating layer.

The insulating layer may include an insulating two-dimensional (2D) material.

The insulating 2D material may include, for example, a hexagonal boron nitride (h-BN).

The insulating layer may be formed on a catalyst metal layer.

The catalyst metal layer may include at least one of copper (Cu), nickel (Ni), iron (Fe), cobalt (Co), platinum (Pt), and ruthenium (Ru).

The nanostructure may include at least one of silicon (Si), germanium (Ge), and SiGe.

The nanostructure may include a nanowire.

The nanowire may be formed by using an evaporation process.

The nanowire may be formed at a deposition substrate temperature of about 340° C. to about 420° C.

The nanowire may be formed by a deposition process performed for about 10 minutes to about 30 minutes.

A plurality of nanowires may form a network structure on the insulating layer.

According to an aspect of another exemplary embodiment, a method of manufacturing a semiconductor device includes forming an insulating layer having a crystal structure, growing at least one semiconductor nanostructure on the insulating layer, and forming a device unit including the semiconductor nanostructure.

The insulating layer may include an insulating two-dimensional (2D) material.

The insulating 2D material may include, for example, a hexagonal boron nitride (h-BN).

The insulating layer may be formed on a catalyst metal layer.

The catalyst metal layer may include at least one of copper (Cu), nickel (Ni), iron (Fe), cobalt (Co), platinum (Pt), and ruthenium (Ru).

The nanostructure may include at least one of silicon (Si), germanium (Ge), and SiGe.

The nanostructure may include a nanowire.

The nanowire may be formed by an evaporation process.

The nanowire may be formed at a deposition substrate temperature of about 340° C. to about 420° C.

A deposition process for forming the nanowire may be performed for about 10 minutes to about 30 minutes.

The method may further include: forming the insulating layer on a catalyst metal layer; forming the nanowire on the insulating layer; attaching the catalyst metal layer having the insulating layer and the nanowire formed thereon to a surface of a substrate; and forming the device unit including the nanowire on the substrate.

The method may further include: forming the insulating layer on a catalyst metal layer; forming the nanowire on the insulating layer; removing the catalyst metal layer from the insulating layer; attaching the insulating layer having the nanowire formed thereon to a surface of a substrate; and forming the device unit including the nanowire on the substrate.

The method may further include: forming a catalyst metal layer on a substrate; forming the insulating layer on the catalyst metal layer; forming the nanowire on the insulating layer; and forming the device unit including the nanowire.

The method may further include: forming the insulating layer on a substrate by a transfer process; forming the nanowire on the insulating layer; and forming the device unit including the nanowire.

The forming of the device unit may include: forming a first electrode contacting a first end portion of the nanowire; and forming a second electrode contacting a second end portion of the nanowire.

The forming of the device unit may further include forming a gate for applying an electric field to the nanowire.

The device unit may use a substrate or a catalyst metal provided below the insulating layer as a bottom gate, and/or the device unit may be formed to further include a top gate provided above the nanowire.

The nanowire may have at least one of a PN structure, a PIN structure, an NPN structure, and a PNP structure.

A semiconductor element layer including a plurality of nanowires may be formed on the insulating layer, the semiconductor element layer may be patterned to form a plurality of active layer regions each having a network structure of nanowires, and the device unit may be formed so as to correspond to each of the active layer regions.

According to an aspect of another exemplary embodiment, a semiconductor device includes: a two-dimensional (2D) insulating layer provided on a substrate and formed of a crystalline insulating 2D material; a semiconductor nanowire directly on the 2D insulating layer; a first electrode contacting a first region of the nanowire; and a second electrode contacting a second region of the nanowire.

The 2D insulating layer may include, for example, a hexagonal boron nitride (h-BN).

The nanowire may include at least one of silicon (Si), germanium (Ge), and SiGe.

The semiconductor device may further include a catalyst metal layer provided between the substrate and the 2D insulating layer.

The catalyst metal layer may include at least one of copper (Cu), nickel (Ni), iron (Fe), cobalt (Co), platinum (Pt), and ruthenium (Ru).

At least a portion of the substrate may be used as a bottom gate, or a catalyst metal layer provided between the substrate and the 2D insulating layer may be used as a bottom gate.

The semiconductor device may further include a gate insulating layer and a top gate provided on the nanowire.

The nanowire may have at least one of a PN structure, a PIN structure, an NPN structure, and a PNP structure.

An active layer region having a network structure of nanowires may be provided on the 2D insulating layer, the first electrode may contact a first region of the active layer region, and the second electrode may contact a second region of the active layer region.

The semiconductor device may further include a gate for applying an electric field to the active layer region.

The semiconductor device may be a transistor or a diode.

The semiconductor device may be an optical device or a sensor.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and/or other aspects will become apparent and more readily appreciated from the following description of exemplary embodiments, taken in conjunction with the accompanying drawings in which.

DETAILED DESCRIPTION

Figure 1A:
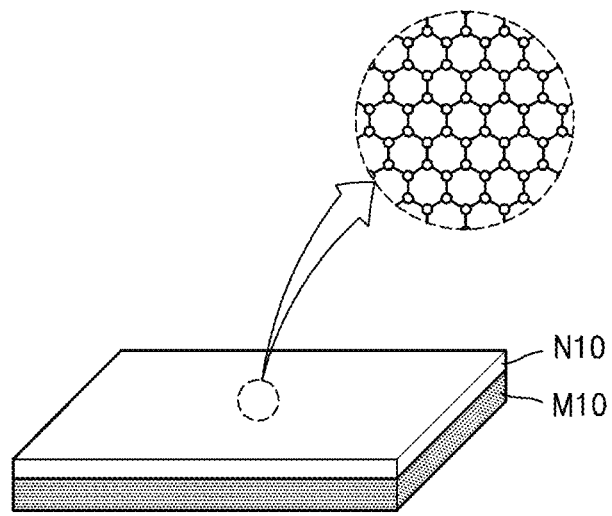
FIGS. 1A and 1B are perspective views illustrating a method of forming a nanostructure according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects thereof. As used herein, the term "and/or" includes any and all combinations of one or more of the associated listed items. Expressions such as "at least one of," when preceding a list of elements, modify the entire list of elements and do not modify the individual elements of the list.

Various exemplary embodiments will now be described more fully with reference to the accompanying drawings in which exemplary embodiments are shown.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items.

It will be understood that, although the terms "first", "second", etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the exemplary embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a", "an", and "the" are intended to include the plural forms as well, unless the context clearly indicates otherwise. It will be further understood that the terms "comprise", "include", and/or "have", when used in this specification, specify the presence of stated features, integers, steps, operations, elements, and/or components, but do not preclude the presence or addition of one or more other features, integers, steps, operations, elements, components, and/or groups thereof unless indicated otherwise.

Exemplary embodiments are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments should not be construed as limited to the particular shapes of regions illustrated herein but should be construed to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, methods of forming nanostructures, methods of manufacturing semiconductor devices using the same, and semiconductor devices including nanostructures according to exemplary embodiments will be described in detail with reference to the accompanying drawings. The widths and thicknesses of layers or regions illustrated in the accompanying drawings may be exaggerated for clarity and convenience of description. Like reference numerals may denote like elements throughout the specification.

Figure 1B:
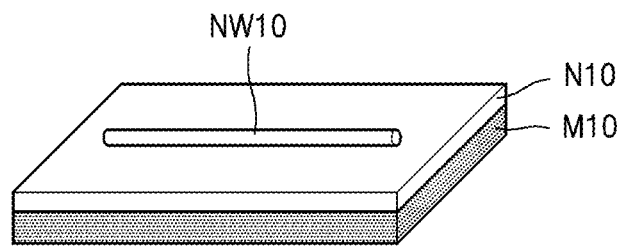

FIGS. 1A and 1B are perspective views illustrating a method of forming a nanostructure according to an exemplary embodiment. Herein, the nanostructure may include a nanowire.

Referring to FIG. 1A, an insulating layer N10 having a crystal structure (i.e., a crystalline insulating layer) may be formed on an underlayer M10. The insulating layer N10 may include, for example, a crystalline insulating two-dimensional (2D) material. The underlayer M10 may be a layer including a catalyst metal for forming the insulating layer N10. In other words, the underlayer M10 may be a catalyst metal layer. Hereinafter, the underlayer M10 will be referred to as a catalyst metal layer M10. The catalyst metal layer M10 may include at least one of copper (Cu), nickel (Ni), iron (Fe), cobalt (Co), platinum (Pt), and ruthenium (Ru), for example. The catalyst metal layer M10 may have a single-layer structure or a multilayer structure including at least one of a Cu layer, an Ni layer, an Fe layer, a Co layer, a Pt layer, and an Ru layer. For example, a Cu foil or a Cu thin film may be used as the catalyst metal layer M10. The catalyst metal layer M10 may be referred to as a base layer or a seed layer for growing the insulating layer N10 having a crystal structure.

The insulating layer N10 may be formed so as to include an insulating 2D material. In this regard, the insulating layer N10 may be referred to as a 2D insulating layer. In general, a 2D material may be a single-layer or half-layer solid in which atoms form a crystal structure. An example of the 2D material is graphene. Graphene may have conductive properties in some cases and may have semiconductor properties in some cases. A metal chalcogenide-based material, such as a transition metal dichalcogenide (TMDC) material, may be a 2D material having semiconductor properties (i.e., a 2D semiconductor). In the present exemplary embodiment, instead of a 2D conductor such as a graphene or a 2D semiconductor such as a TMDC, a 2D material having insulator properties (i.e., an insulating 2D material or a 2D insulator) may be used to form the insulating layer N10. The insulating 2D material constituting the insulating layer N10 may be a crystalline material having a 2D crystal structure. As an example, the insulating layer N10 may include a hexagonal boron nitride (h-BN) as the insulating 2D material. The insulating layer N10 may be an h-BN layer. In one example, the h-BN layer may be deposited on the catalyst metal layer M10 by a process such as chemical vapor deposition (CVD). When the insulating layer N10 is an h-BN layer, the insulating layer N10 may have a hexagonal crystal structure as illustrated in the partial enlarged view of FIG. 1A. However, the crystal structure of the insulating layer N10 is not limited to a hexagonal crystal structure and may vary according to various exemplary embodiments. Since the insulating layer N10 according to the present exemplary embodiment is crystalline, it may have excellent uniformity and excellent surface properties in comparison with an amorphous insulating layer.

When the insulating layer N10 includes an h-BN that is a 2D material, the insulating layer N10 may include a single-layer h-BN or include repeatedly-stacked layers of h-BN. In an electronic structure, the 2D material may be defined as a material having a density of state (DOS) conforming to a quantum well behavior. A material with a stack of 2D unit material layers (about 100 or less layers) may also have a DOS conforming to a quantum well behavior. In this regard, a repeatedly-stacked structure of 2D unit material layers may also be referred to as a 2D material. In this respect, the insulating layer N10 having a structure of repeatedly-stacked single layers of h-BNs may also be referred to as a 2D material layer. For example, the insulating layer N10 may include less than about 10 stacked layers of h-BN and may have a thickness of about 10 nm or less or about 5 nm or less. When the insulating layer N10 includes about 5 or 6 stacked layers of h-BN, it may have a thickness of about 3 nm. However, in some cases, the insulating layer N10 may include about 10 or more stacked h-BN layers and may have a thickness of about 10 nm or more. Also, the insulating layer N10 may include another material other than the h-BN.

Referring to FIG. 1B, at least one semiconductor nanowire (hereinafter referred to as nanowire) NW10 may be formed on the insulating layer N10. The nanowire NW10 may have, for example, a diameter (or width) of about several nm to about hundreds of nm. The diameter (or width) of the nanowire NW10 may be about several nm to about tens of nm. The nanowire NW10 may include, for example, at least one of silicon (Si), germanium (Ge), and SiGe. The nanowire NW10 may be an Si nanowire, a Ge nanowire, or an SiGe nanowire. However, the materials of the nanowire NW10 are not limited to the above materials and may vary according to various exemplary embodiments. The nanowire NW10 may have a crystal structure. The nanowire NW10 may be polycrystalline or may be monocrystalline in some cases. The crystal structure of the nanowire NW10 may be affected by the crystal structure of the insulating layer N10. In other words, the nanowire NW10 may be formed by using the crystal structure of the insulating layer N10 as a kind of template or seed. When the nanowire NW10 has a crystal structure, it may have excellent physical properties. However, the nanowire NW10 may include an amorphous region according to the formation conditions thereof.

The nanowire NW10 may be formed by a growth method (or process). In other words, the nanowire NW10 may be directly grown on the insulating layer N10. As an example, the nanowire NW10 may be formed (grown) by an evaporation process as a kind of physical vapor deposition (PVD) process. The evaporation process may be, for example, a vacuum thermal evaporation process. When the nanowire NW10 is formed by an evaporation process, the heating temperature of a deposition substrate may be, for example, about 340° C. to about 420° C. Herein, the deposition substrate may be a substrate on which the structure (i.e., the structure of FIG. 1A) including the catalyst metal layer M10 and the insulating layer N10 is mounted or held, and the heating temperature of the deposition substrate may correspond to the temperature of the catalyst metal layer M10 and/or the insulating layer N10. Thus, the nanowire NW10 may be formed on the insulating layer N10 while the catalyst metal layer M10 and the insulating layer N10 are heated to a temperature of about 340° C. to about 420° C. Also, a deposition process for forming the nanowire NW10 by the evaporation process may be performed for about 10 minutes to about 30 minutes or for about 15 minutes to about 30 minutes. The heating temperature of the deposition substrate and/or the duration time of the deposition process may be properly adjusted, and the size, number, and/or properties of nanowires NW10 may be controlled accordingly. The deposition conditions for forming the nanowire NW10 will be described later in more detail with reference to FIGS. 4 to 13. The detailed deposition conditions presented herein are merely exemplary, and the deposition conditions for forming the nanowire NW10 may vary according to the deposition equipment or methods.

Although FIG. 1B illustrates the case of forming one nanowire NW10, a plurality of nanowires NW10 may also be formed on the insulating layer N10. An example thereof is illustrated in FIGS. 2A to 2B.

Figure 2A:
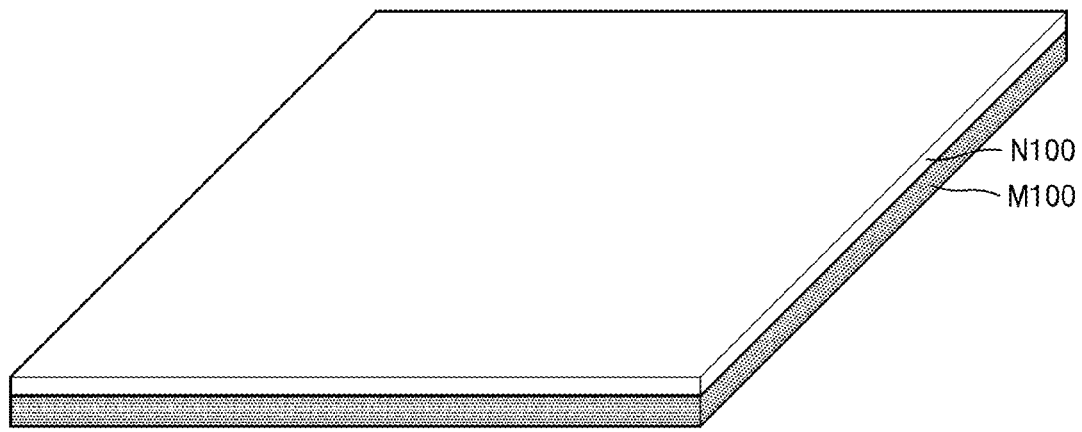
FIGS. 2A and 2B are perspective views illustrating a method of forming a nanostructure according to another exemplary embodiment.
Figure 2B:
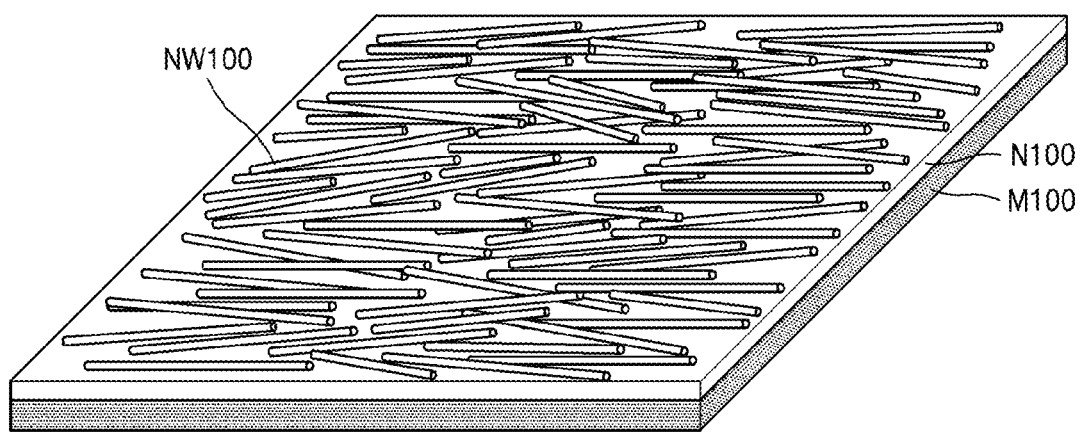

FIGS. 2A and 2B are perspective views illustrating a method of forming a nanostructure according to another exemplary embodiment. The nanostructure according to the present exemplary embodiment may include a plurality of nanowires. The nanostructure may have a network structure of nanowires or any similar structure thereof.

Referring to FIG. 2A, an insulating layer N100 having a crystal structure may be formed on a catalyst metal layer M100. The catalyst metal layer M100 and the insulating layer N100 may correspond respectively to the catalyst metal layer M10 and the insulating layer N10 of FIG. 1A. The catalyst metal layer M100 may include, for example, Cu, Ni, Fe, Co, Pt, and/or Ru. The insulating layer N100 may be formed to include a crystalline insulating 2D material. The 2D material may be, for example, an h-BN.

Referring to FIG. 2B, a plurality of semiconductor nanowires (hereinafter referred to as nanowires) NW100 may be formed on the insulating layer N100. At least some of the nanowires NW100 may form a network structure. In other words, the nanowires NW100 may have a network structure. The formation method and/or materials of the nanowires NW100 may be similar or identical to those of the nanowire NW10 illustrated in FIG. 1B. Thus, the nanowires NW100 may include, for example, at least one of Si, Ge, and SiGe. Also, the nanowires NW100 may be formed by an evaporation process as a kind of PVD process. In this case, when the nanowire NW100 is formed, the heating temperature of the deposition substrate may be, for example, about 340° C. to about 420° C. Also, the duration time of the deposition process for forming the nanowire NW100 may be about 10 minutes to about 30 minutes or about 15 minutes to about 30 minutes. The heating temperature of the deposition substrate and/or the duration time of the deposition process may be adjusted to control the size, number, density, and/or properties of nanowires NW100. The nanowires NW100 may contact (or be connected to) each other while constituting about one layer (or a single layer). Each of the nanowires NW 100 may be referred to as a nanofiber, and in this case, the nanowires NW 100 may be referred to as forming a nanofiber network structure. The shape and arrangement of the nanowires NW100 illustrated in FIG. 2B are merely exemplary and may vary according to various exemplary embodiments.

As described with reference to FIGS. 1A and 1B and FIGS. 2A and 2B, according to the exemplary embodiment, the nanowire NW10/NW100 may be directly grown (formed) on the insulating layer N10/N100 having a crystal structure. Thus, a semiconductor device including the nanowire NW10/NW100 on the insulating layer N10/N100 may be easily manufactured. If the nanowire NW10/NW100 is grown on a conductor or semiconductor instead of the insulating layer N10/N100, it may be necessary to separate the nanowire NW10/NW100 from the conductor or semiconductor, transfer the separated nanowire NW10/NW100 to a separate insulating substrate, and manufacture a semiconductor device on the separate insulating substrate. In such a case, the process of separating and transferring the nanowire NW10/NW100 may be difficult, and the commercialization/large-area processing thereof may be difficult. However, according to the present exemplary embodiment, since the nanowire NW10/NW100 may be directly formed on the insulating layer N10/N100, the semiconductor device including the nanowire NW10/NW100 on the insulating layer N10/N100 may be easily manufactured without a separating and transferring process. Since this method may be easily applied to large-area processes, it may have a relatively-high possibility of being commercialized.

Also, when the insulating layer N10/N100 is used as a component such as the gate insulating layer of a semiconductor device (transistor), the performance and uniformity of the semiconductor device (transistor) may be improved. This will be described below in more detail. Since the insulating layer N10/N100 is crystalline, it may have significantly uniform properties and excellent surface properties in comparison with an amorphous insulating layer (e.g., an $SiO_2$ layer). Thus, when the insulating layer N10/N100 is applied to a component of a device, an excellent-performance semiconductor device having almost no change (difference) between devices may be implemented. That is, it may be advantageous for obtaining uniformity and performance improvement. Also, since the insulating layer N10/N100 has excellent surface properties (e.g., flat and smooth surface properties), it may have excellent relevant properties and may be easily processed. A method of manufacturing a semiconductor device by using the structure of FIG. 1B or 2B will be described later in more detail.

Additionally, after the structure of FIG. 2B is formed, the structure of FIG. 1B may be formed therefrom. In other words, a portion of the structure of FIG. 2B may correspond to the structure of FIG. 1B. When the formation density of the nanowires NW100 in FIG. 2B is low (that is, the number of nanowires per unit area is small) and the formation positions thereof are controlled relatively uniformly, the structure of FIG. 1B may be easily obtained therefrom. In this case, a lithography process and/or a dry etching process may be properly used. This may be well known to those of ordinary skill in the art, and thus detailed descriptions thereof will be omitted for conciseness.

Figure 3:
FIG. 3 is a scanning tunneling microscope (STM) image showing a crystal structure of an insulating layer formed on an underlayer according to an exemplary embodiment.

FIG. 3 is a scanning tunneling microscope (STM) image showing the crystal structure of an insulating layer (2D insulating layer) formed on an underlayer (catalyst metal layer) according to an exemplary embodiment. The underlayer (catalyst metal layer) is a Cu layer (Cu foil), and the insulating layer (2D insulating layer) is an h-BN layer. Referring to FIG. 3, it may be seen that the h-BN layer has a two-dimensionally uniform hexagonal crystal structure. In FIG. 3, the lattice constant of the h-BN layer is about 2.5 Å.

Table 1 below summarizes various process conditions for growing a nanostructure on an insulating layer having a crystal structure. When an Si nanostructure is deposited (grown) by an evaporation process on an h-BN layer that is a crystalline insulating layer formed on a Cu layer (catalyst metal layer), the change of the resulting deposited structure (i.e., an Si nanostructure) is analyzed while changing the deposition conditions. For the purposes of Table 1, the evaporation process is a vacuum thermal evaporation process.

TABLE 1

|  | Deposition Substrate Temperature (° C.) | Deposition Duration Time (min) |
| --- | --- | --- |
| Sample #1 | 500 | 20 |
| Sample #2 | 265 | 20 |
| Sample #3 | 380 | 20 |
| Sample #4 | 260 | 30 |

As summarized in Table 1, Sample #1 corresponds to performing the deposition process for a duration of 20 minutes with the deposition substrate heated to a temperature of 500° C. Sample #2 corresponds to performing the deposition process for a duration of 20 minutes with the deposition substrate heated to a temperature of 265° C. Sample #3 corresponds to performing the deposition process for a duration of 20 minutes with the deposition substrate heated to a temperature of 380° C. Sample #4 corresponds to performing the deposition process for a duration of 30 minutes with the deposition substrate heated to a temperature of 260° C.

Figure 4:
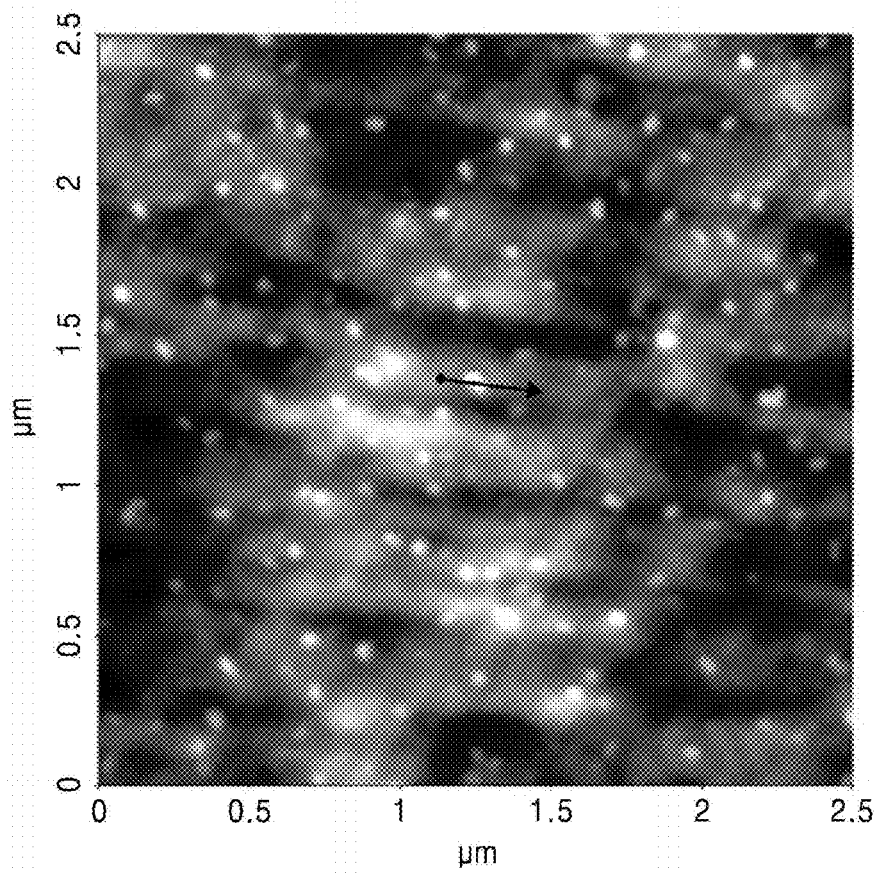
FIG. 4 is an atomic force microscope (AFM) image showing a silicon (Si) nanostructure formed under the conditions of Sample #1 of Table 1.

FIG. 4 is an atomic force microscope (AFM) image showing an Si nanostructure formed under the conditions of Sample #1. Referring to FIG. 4, it may be seen that Si nanoparticles are formed and distributed relatively uniformly.

Figure 5:
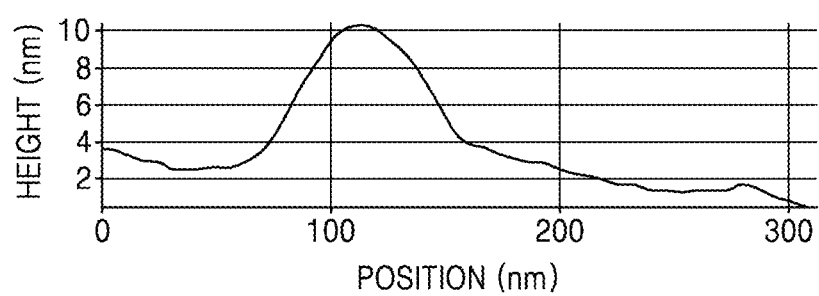
FIG. 5 is a graph illustrating a line profile of an Si nanoparticle of FIG. 4.

FIG. 5 is a graph illustrating a line profile of an Si nanoparticle of FIG. 4. That is, FIG. 5 illustrates a line profile of a region represented by the arrow in FIG. 4. The arrow representation will also be used with the same meaning in FIGS. 6, 8, 10, and 12. From the result of FIG. 5, the size (width/height) of the formed Si nanoparticle may be approximately determined.

Figure 6:
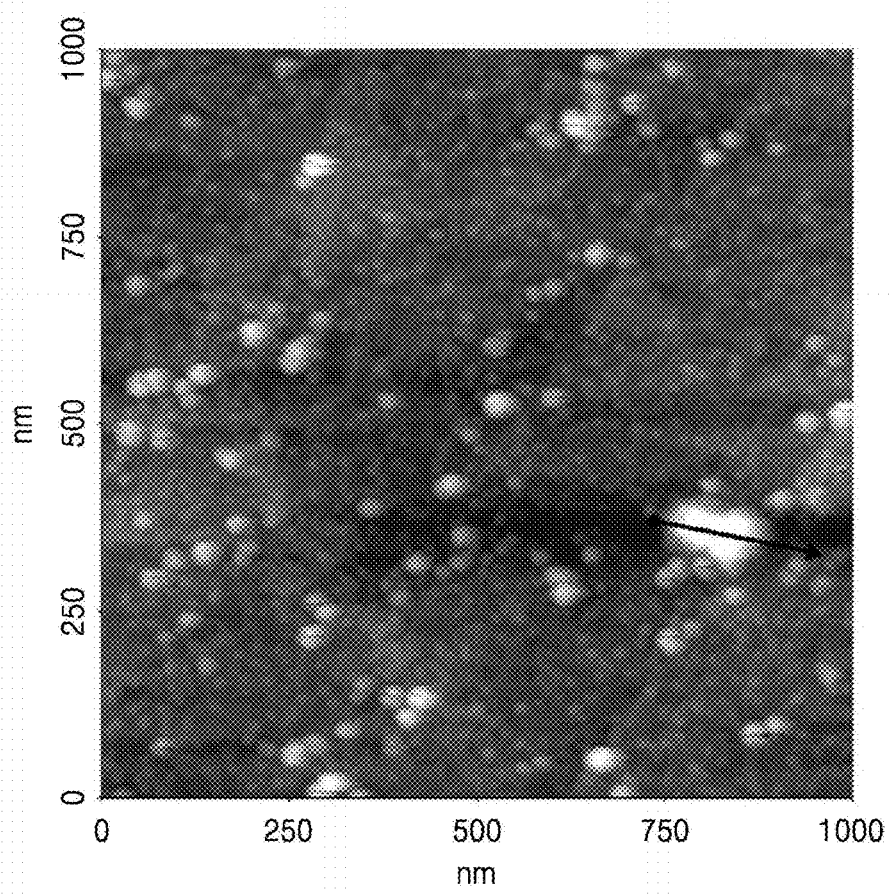
FIG. 6 is an AFM image showing an Si nanostructure formed under the conditions of Sample #2 of Table 1.

FIG. 6 is an AFM image showing an Si nanostructure formed under the conditions of Sample #2. Referring to FIG. 6, it may be seen that Si nanoparticles are formed and distributed relatively uniformly and a plurality of Si clusters are formed.

Figure 7:
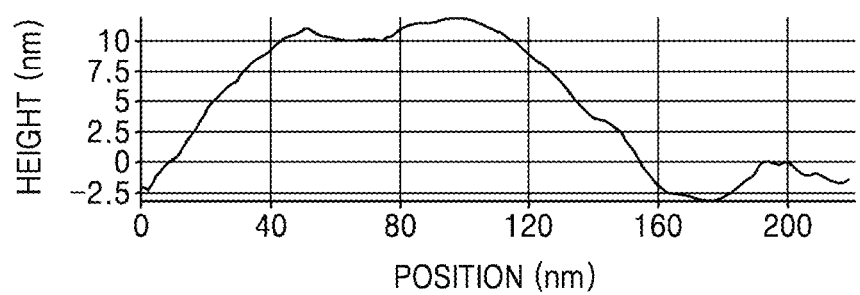
FIG. 7 is a graph illustrating a line profile of an Si cluster of FIG. 6.

FIG. 7 is a graph illustrating a line profile of an Si cluster of FIG. 6. From the result of FIG. 7, the size (width/height) of the Si cluster may be determined.

Figure 8:
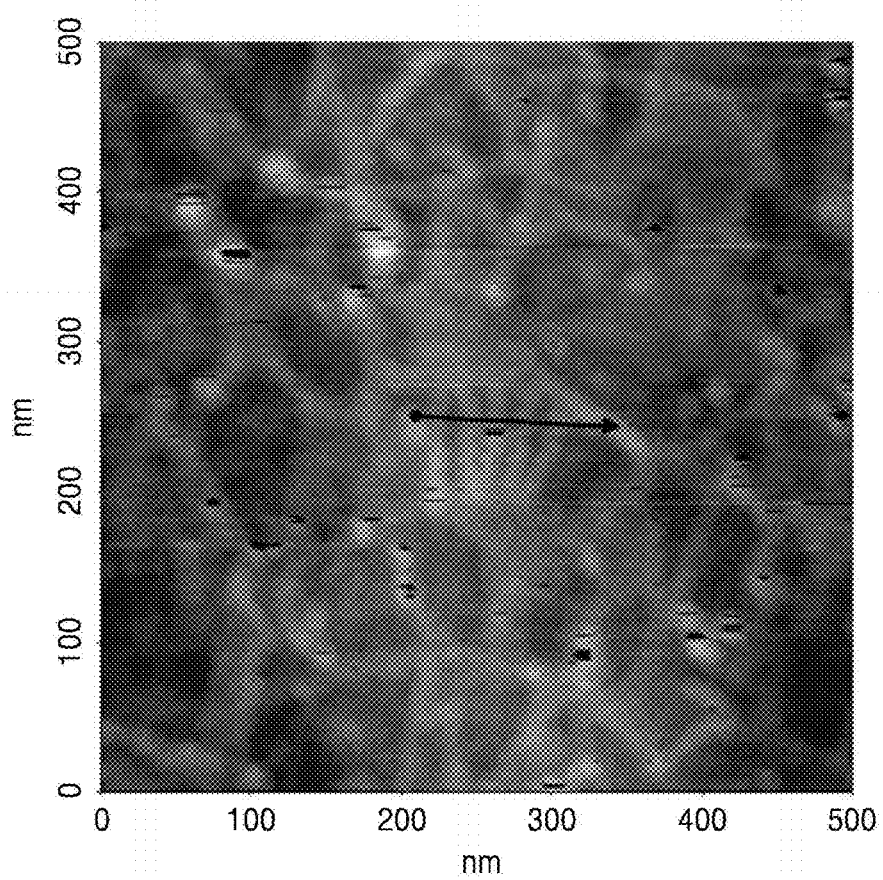
FIG. 8 is an AFM image showing an Si nanostructure (nanowire) formed under the conditions of Sample #3 of Table 1.

FIG. 8 is an AFM image showing an Si nanostructure (nanowire) formed under the conditions of Sample #3. Referring to FIG. 8, it may be seen that a plurality of Si nanowires are relatively randomly disposed so as to form a network structure.

Figure 9:
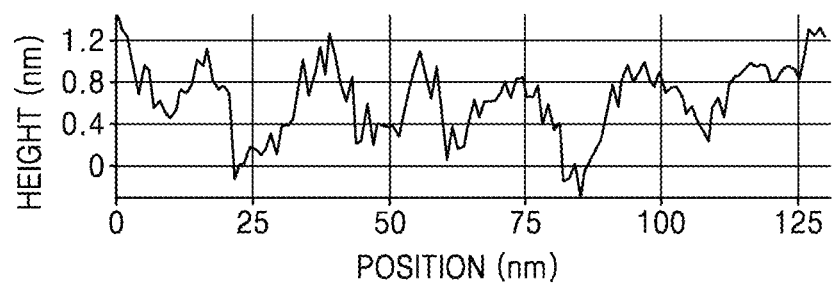
FIG. 9 is a graph illustrating a line profile of the Si nanowires of FIG. 8.

FIG. 9 is a graph illustrating a line profile of Si nanowires of FIG. 8. From FIG. 9, the size (width/height) of the Si nanowires may be approximately determined.

Figure 10:
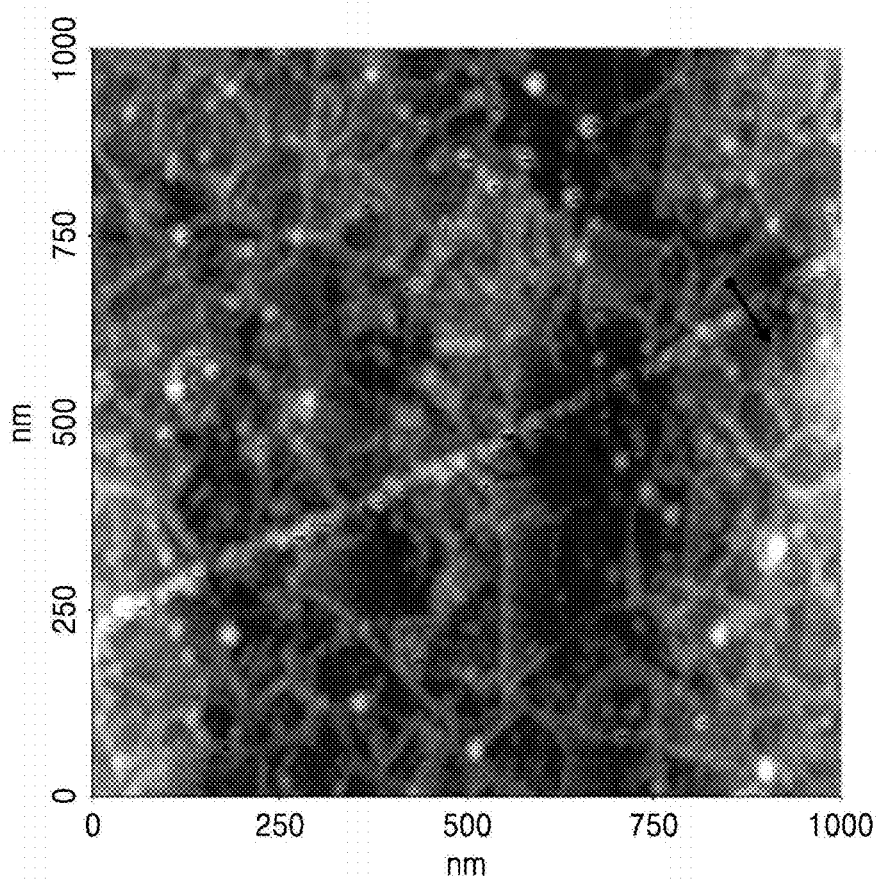
FIG. 10 is an AFM image showing an Si nanostructure (nanowire) formed under the conditions of Sample #3 of Table 1.

FIG. 10 is an AFM image showing an Si nanostructure (nanowire) formed under the conditions of Sample #3. The image of FIG. 10 is similar to the image of FIG. 8. FIGS. 8 and 10 represent AFM images obtained from two different reproductions of Sample #3.

Figure 11:
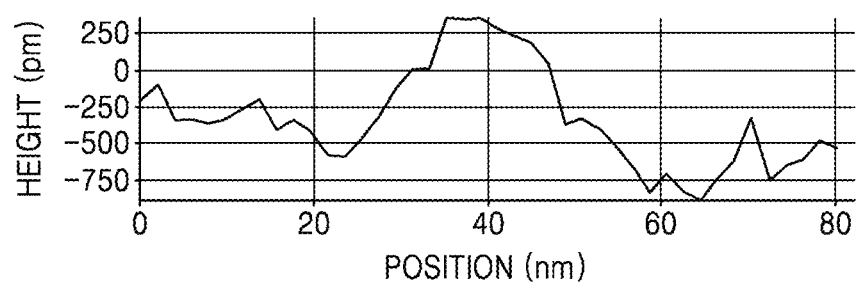
FIG. 11 is a graph illustrating a line profile of an Si nanowire of FIG. 10.

FIG. 11 is a graph illustrating a line profile of an Si nanowire of FIG. 10. From FIG. 11, the size (width/height) of the Si nanowire may be approximately determined.

Figure 12:
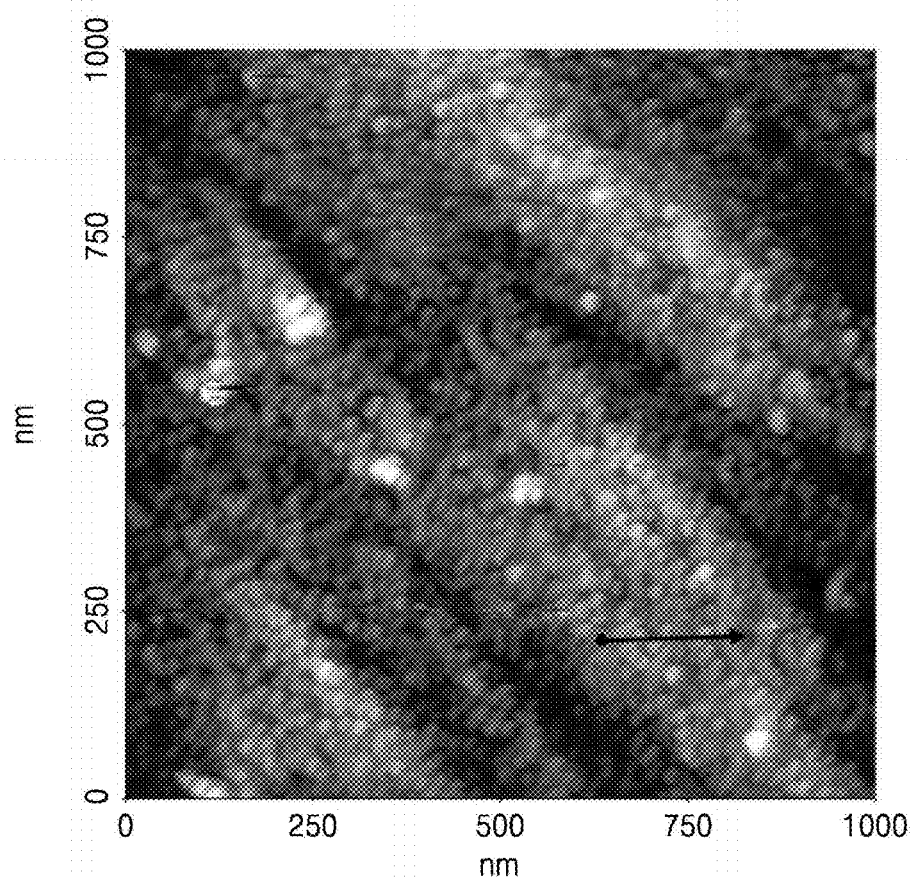
FIG. 12 is an AFM image showing an Si nanostructure formed under the conditions of Sample #4 of Table 1.

FIG. 12 is an AFM image showing an Si nanostructure formed under the conditions of Sample #4. Referring to FIG. 12, it may be seen that Si nanoparticles are formed at a relatively high density and Si clusters are also formed.

Figure 13:
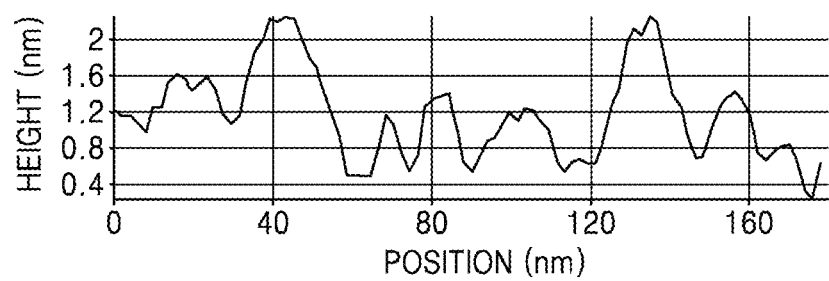
FIG. 13 is a graph illustrating a line profile of the Si nanoparticles of FIG. 12.

FIG. 13 is a graph illustrating a line profile of Si nanoparticles of FIG. 12. From the result of FIG. 13, the size (width/height) of the Si nanoparticles formed under the condition of Sample #4 may be approximately determined.

Among FIGS. 4 to 13, FIGS. 8 to 11 illustrate semiconductor nanowires, and FIGS. 4 to 7, 12, and 13 illustrate the formation of semiconductor nanoparticles or clusters. From this, it may be seen that the process conditions corresponding to FIGS. 8 to 11, that is, the process conditions of Sample #3 in Table 1, are suitable for the formation of nanowires. From the results of FIGS. 4 to 13 and additional experimental data undescribed herein, it may be seen that one or more nanowires may be formed relatively easily when performing a deposition process for a duration of about 10 minutes to about 30 minutes or about 15 minutes to about 30 minutes while heating the deposition substrate to a temperature of about 340° C. to about 420° C. in the case of forming a nanostructure on a crystalline insulating layer by an evaporation process according to an exemplary embodiment. The heating temperature of the deposition substrate and/or the duration time of the deposition process may be properly adjusted, and the size, number, density, and/or properties of one or more nanowires may be controlled accordingly. Also, the conditions for forming one or more nanowires, nanoparticles, or clusters may vary according to the deposition equipment or methods.

Methods of manufacturing semiconductor devices by using the nanostructure forming methods according to exemplary embodiments will be described below.

Figure 14A:
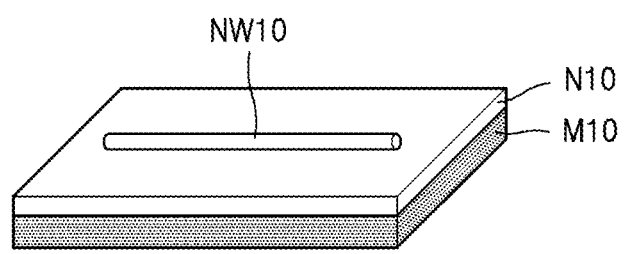
FIGS. 14A and 14B are perspective views illustrating a method of manufacturing a semiconductor device according to an exemplary embodiment.
Figure 14B:
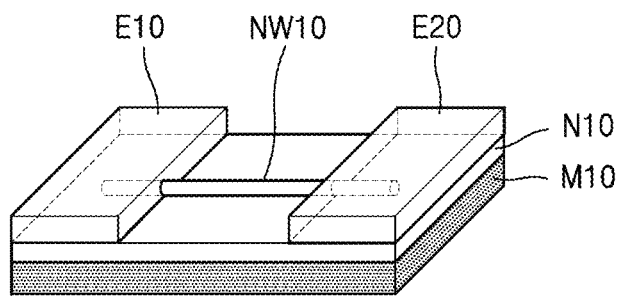

FIGS. 14A and 14B are perspective views illustrating a method of manufacturing a semiconductor device according to an exemplary embodiment.

Referring to FIG. 14A, the structure of FIG. 1B may be prepared. That is, a crystalline insulating layer N10 may be formed on an underlayer (catalyst metal layer) M10, and a semiconductor nanowire NW10 may be formed on the insulating layer N10 by a growth process. The method of forming this structure may be the same as described above, and thus redundant descriptions thereof are not repeated here.

Referring to FIG. 14B, a first electrode E10 contacting a first region (e.g., a first end portion) of the nanowire NW10 and a second electrode E20 contacting a second region (e.g., a second end portion) of the nanowire NW10 may be formed on the insulating layer N10.

The structure of FIG. 14B may be used as a semiconductor device. When the structure of FIG. 14B is used as a transistor, one of the first electrode E10 and the second electrode E20 may be a source electrode and the other one may be a drain electrode. Then, the catalyst metal layer M10 may be used as a gate (bottom gate) for applying an electric field to the nanowire NW10, and the insulating layer N10 may be used as a gate insulating layer. In some cases, a substrate (not illustrated) may be provided below the catalyst metal layer M10, and at least a portion of the substrate may be used as the gate (bottom gate).

The structure of FIG. 14B may also be used as semiconductor device other than a transistor. For example, the structure of FIG. 14B may be used as a two-terminal semiconductor device having two electrodes (i.e., E10 and E20). In this case, for example, the semiconductor device of FIG. 14B may be used as an optical device or a sensor. The optical device may be a light-emitting device or a light-receiving device. The light-emitting device may be, for example, a laser diode (LD) or a light-emitting diode (LED), and the light-receiving device may be, for example, a photodiode. In this optical device, the nanowire NW10 may be used as a light-emitting element or a photoelectric conversion element. The sensor may be an optical sensor or a chemical sensor. In such a case, a property, such as the electrical conductivity, of the nanowire NW10 may be changed by a chemical species or light. The structure of FIG. 14B may also be used as a diode. In such a case, the nanowire NW10 may have a PN structure or a PIN structure.

When the structure of FIG. 14B is used as a transistor, a gate (top gate) may be further formed above the nanowire NW10. An example thereof is illustrated in FIG. 15.

Figure 15:
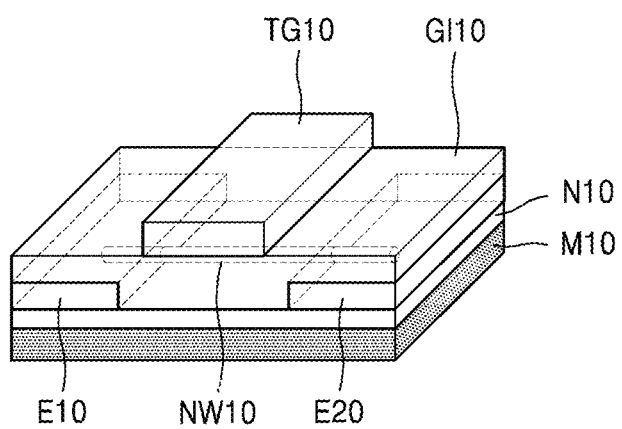
FIG. 15 is a perspective view illustrating a semiconductor device and a method of manufacturing the same according to another exemplary embodiment.

Referring to FIG. 15, a gate insulating layer GI10 covering the nanowire NW10 may be formed on the insulating layer N10 in the structure of FIG. 14B. The gate insulating layer GI10 may be formed to cover the first and second electrodes E10 and E20. The gate insulating layer GI10 may include a silicon oxide, a silicon nitride, a silicon oxynitride, or a high-dielectric material having a higher dielectric constant than the silicon nitride, and may have a single-layer or multilayer structure including at least one of the materials above. Also, the gate insulating layer GI10 may be formed so as to include an organic insulating material. Thereafter, a top gate TG10 may be formed on the gate insulating layer GI10. The top gate TG10 may include a metal and/or a metal compound. Any conductive material used in the semiconductor device may be used as the material of the top gate TG10. When the catalyst metal layer M10 is used as a bottom gate in the structure of FIG. 15, the insulating layer N10 may be referred to as a first gate insulating layer. In such a case, the gate insulating layer GI10 formed on the nanowire NW10 may be referred to as a second gate insulating layer. When the top gate TG10 is used and also the catalyst metal layer M10 is used as the bottom gate, the semiconductor device of the present exemplary embodiment may be referred to as a double-gate transistor having a double-gate structure. However, in some cases, only one of the top gate TG10 and the catalyst metal layer M10 may be used as a gate.

Figure 16A:
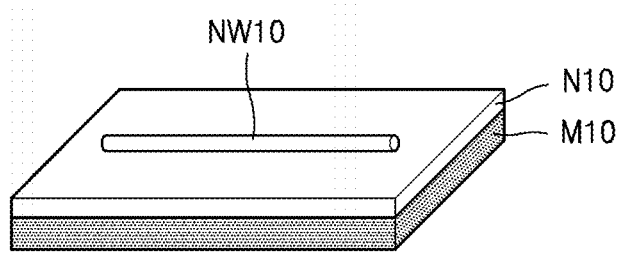
FIGS. 16A to 16C are perspective views illustrating a method of manufacturing a semiconductor device according to another exemplary embodiment.
Figure 16B:
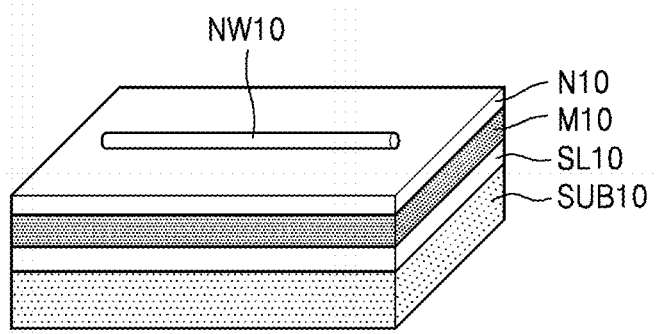
Figure 16C:
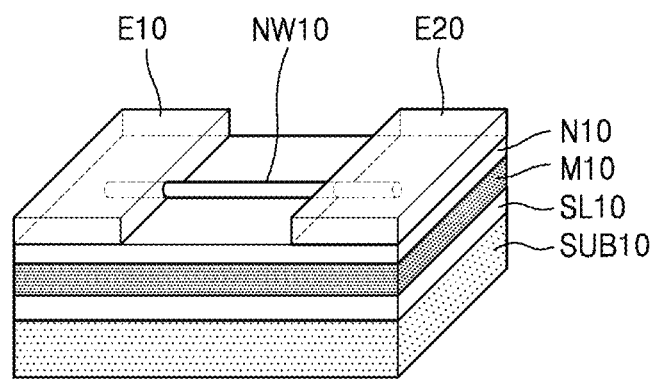

FIGS. 16A to 16C are perspective views illustrating a method of manufacturing a semiconductor device according to another exemplary embodiment.

Referring to FIG. 16A, like the structure of FIG. 1B, a crystalline insulating layer N10 may be formed on an underlayer (catalyst metal layer) M10, and a semiconductor nanowire NW10 may be formed on the insulating layer N10.

Referring to FIG. 16B, the structure of FIG. 16A may be attached to one side of a substrate SUB10. The substrate SUB10 may be, for example, a semiconductor substrate such as a silicon substrate. In this case, a surface insulating layer SL10, such as a silicon oxide layer, may be formed on a surface of the substrate SUB10, and the catalyst metal layer M10 may be attached to the surface insulating layer SL10. The surface insulating layer SL10 may be considered a portion of the substrate SUB10. The type of substrate SUB10 and the material of the surface insulating layer SL10 may vary according to various exemplary embodiments. The surface insulating layer SL10 may, in some embodiments, not be provided.

Referring to FIG. 16C, a device unit including the nanowire NW10 may be formed on the substrate SUB10. For example, first and second electrodes E10 and E20 contacting the nanowire NW10 may be formed on the insulating layer N10. The first and second electrodes E10 and E20 may be identical or similar to the first and second electrodes E10 and E20 described with reference to FIG. 14B.

The structure of FIG. 16C may be used as a semiconductor device, similar to the structure of FIG. 14B described above. When the structure of FIG. 16C is used as a transistor, the catalyst metal layer M10 or the substrate SUB10 may be used as a bottom gate. The insulating layer N10 may be a gate insulating layer. Also, the structure of FIG. 16C may be used as a semiconductor device other than a transistor. For example, the structure of FIG. 16C may be used as an optical device or a sensor. Also, the structure of FIG. 16C may be a diode, as described with reference to FIG. 14B.

Figure 17:
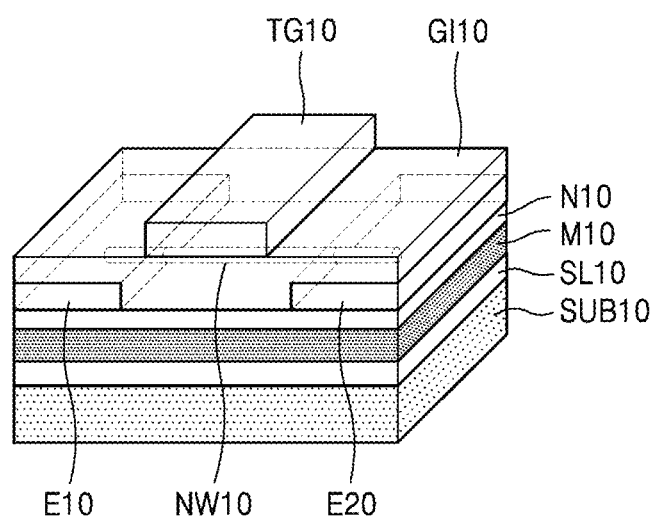
FIG. 17 is a perspective view illustrating a semiconductor device and a method of manufacturing the same according to another exemplary embodiment.

When the structure of FIG. 16C is used as a transistor, a gate (top gate) may be further formed above the nanowire NW10. An example thereof is illustrated in FIG. 17. Referring to FIG. 17, a gate insulating layer GI10 covering the nanowire NW10 may be formed on the insulating layer N10 in the structure of FIG. 16C, and a top gate TG10 may be formed on the gate insulating layer GI10. The structure of FIG. 17 may be similar to the structure of FIG. 15.

FIGS. 18A to 18D are perspective views illustrating a method of manufacturing a semiconductor device according to another exemplary embodiment.

Figure 18A:
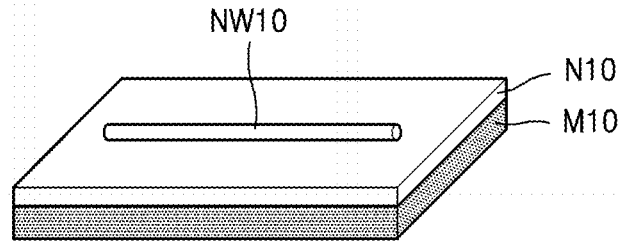
FIGS. 18A to 18D are perspective views illustrating a method of manufacturing a semiconductor device according to another exemplary embodiment.

Referring to FIG. 18A, like the structure of FIG. 1B, a crystalline insulating layer N10 may be formed on an underlayer (catalyst metal layer) M10, and a semiconductor nanowire NW10 may be formed on the insulating layer N10.

Figure 18B:
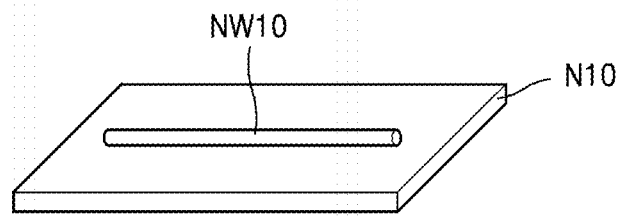

Thereafter, the catalyst metal layer M10 may be removed from the insulating layer N10. A resulting structure thereof is illustrated in FIG. 18B. The catalyst metal layer M10 may be removed (e.g., etched) by using a metal etchant. For example, a metal etchant such as $FeCl_3$ and $HNO_3$ may be used to etch the catalyst metal layer M10.

Figure 18C:
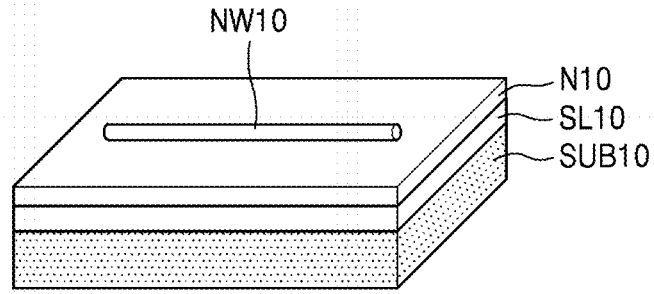

Referring to FIG. 18C, the structure of FIG. 18B may be attached to one side of a substrate SUB10. The substrate SUB10 may be, for example, a semiconductor substrate such as a silicon substrate. In such a case, a surface insulating layer SL10, such as a silicon oxide layer, may be formed on a surface of the substrate SUB10. The insulating layer N10 may be attached to the surface insulating layer SL10. The type of substrate SUB10 and the material of the surface insulating layer SL10 may vary according to various exemplary embodiments, and the surface insulating layer SL10 may not be provided in some embodiments.

The process of FIGS. 18A to 18C may be referred to as a process of transferring the insulating layer N10 and the nanowire NW10 from the catalyst metal layer M10 (i.e., an initial substrate) onto the substrate SUB10. In order to facilitate this transfer process, the catalyst metal layer M10 may be removed with a passivation layer formed on the insulating layer N10 in the operation of FIG. 18A, and the insulating layer N10 having the passivation layer formed thereon may be attached on the substrate SUB10 as illustrated in FIG. 18C. Thereafter, the passivation layer may be removed therefrom.

Figure 18D:
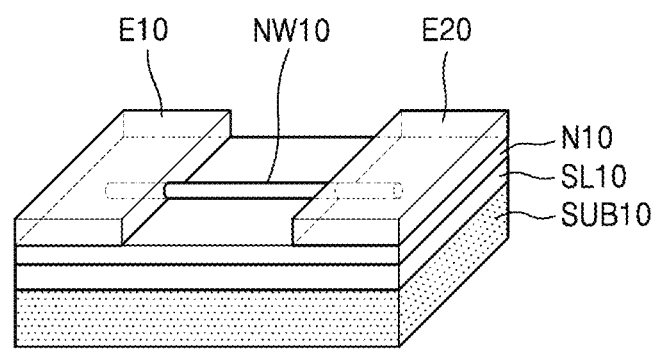

Referring to FIG. 18D, a device unit including the nanowire NW10 may be formed on the substrate SUB10. For example, first and second electrodes E10 and E20 contacting the nanowire NW10 may be formed on the insulating layer N10. The first and second electrodes E10 and E20 may be identical or similar to the first and second electrodes E10 and E20 described with reference to FIG. 14B.

The structure of FIG. 18D may be used as a semiconductor device. When the structure of FIG. 18D is used as a transistor, the substrate SUB10 may be used as a bottom gate. In such a case, both the surface insulating layer SL10 and the crystalline insulating layer N10 may be used as gate insulating layers. In such a case, a gate insulating layer portion contacting the nanowire NW10 used as a channel element of the transistor, that is, the insulating layer N10, may affect the performance of the transistor relatively greatly. According to the present exemplary embodiment, since the insulating layer N10 is crystalline and has excellent uniformity and surface properties, the performance of the semiconductor device (transistor) may be improved by the insulating layer N10. The structure of FIG. 18D may be used as a semiconductor device other than a transistor. For example, the structure of FIG. 18D may be used as an optical device or a sensor. Also, the structure of FIG. 18D may be a diode.

Figure 19:
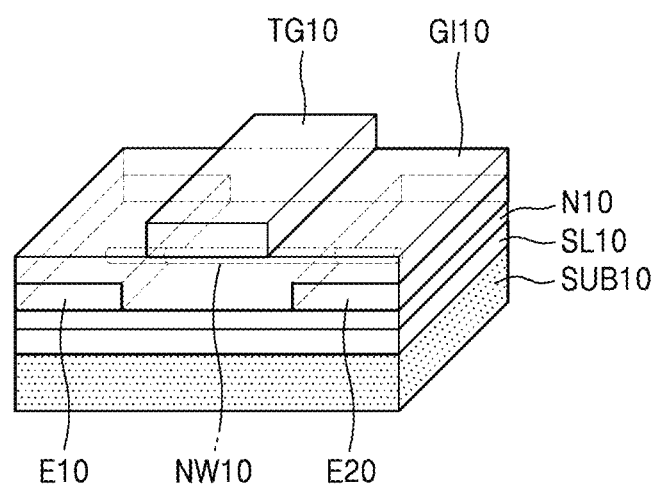
FIG. 19 is a perspective view illustrating a semiconductor device and a method of manufacturing the same according to another exemplary embodiment.

When the structure of FIG. 18D is used as a transistor, a gate (top gate) may be further formed above the nanowire NW10. An example thereof is illustrated in FIG. 19. Referring to FIG. 19, a gate insulating layer GI10 covering the nanowire NW10 may be formed on the insulating layer N10, and a top gate TG10 may be formed on the gate insulating layer GI10. The structure of FIG. 19 may be similar in this respect to the structure of FIG. 17.

In FIGS. 16A and 18A, the catalyst metal layer M10 may be, for example, a metal foil. As an example, the catalyst metal layer M10 may be a Cu foil. The process of FIG. 16A to 16C or the process of FIGS. 18A to 18D may be performed by using the metal foil as a starting material. However, according to another exemplary embodiment, a substrate (semiconductor substrate) may be used as the starting material. An example thereof is illustrated in FIGS. 20A to 20D.

FIGS. 20A to 20D are perspective views illustrating a method of manufacturing a semiconductor device according to another exemplary embodiment.

Figure 20A:
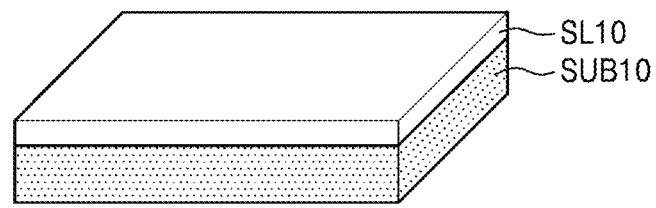
FIGS. 20A to 20D are perspective views illustrating a method of manufacturing a semiconductor device according to another exemplary embodiment.

Referring to FIG. 20A, a substrate SUB10 may be prepared. The substrate SUB10 may be a semiconductor substrate such as a silicon substrate. In this case, a surface insulating layer SL10, such as a silicon oxide layer, may be formed on a surface of the substrate SUB10. The surface insulating layer SL10 may be a native oxide layer or an artificially-formed layer. The surface insulating layer SL10 may be considered as being included in the substrate SUB10. The structure of FIG. 20A may be a silicon-on-insulator (SOI) wafer or a silicon wafer having an $SiO_2$ layer formed on a surface thereof. However, the material of the substrate SUB10 and the material of the surface insulating layer SL10 may vary according to various exemplary embodiments. The surface insulating layer SL10 may not be used in some embodiments.

Figure 20B:
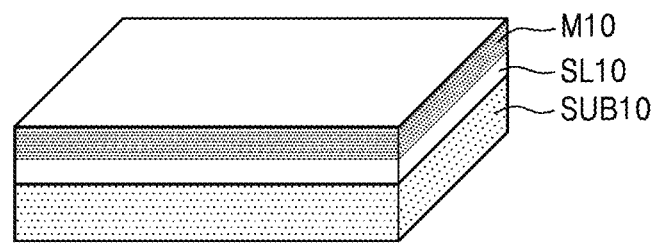

Referring to FIG. 20B, a catalyst metal layer M10 may be formed on the surface insulating layer SL10. Herein, the catalyst metal layer M10 may be a thin film formed by a deposition process, instead of a metal foil.

Figure 20C:
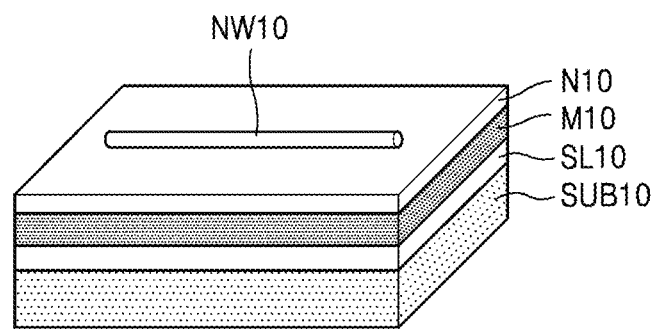

Referring to FIG. 20C, a crystalline insulating layer N10 may be formed on the catalyst metal layer M10. The method of forming the insulating layer N10 may be the same as the method of forming the insulating layer N10 on the catalyst metal layer M10 as illustrated in FIG. 1A. The insulating layer N10 may include, for example, an insulating 2D material having a crystal structure. The insulating 2D material may be, for example, an h-BN. The insulating layer N10 may be formed, for example, by a CVD process. Thereafter, at least one semiconductor nanowire NW10 may be formed on the insulating layer N10 by a growth process. The detailed deposition conditions, the formation method, and/or the material of the nanowire NW10 may be the same as described with reference to, for example, FIG. 1B. By using a method according to an exemplary embodiment, the nanowire NW10 may be directly grown on the insulating layer N10.

Figure 20D:
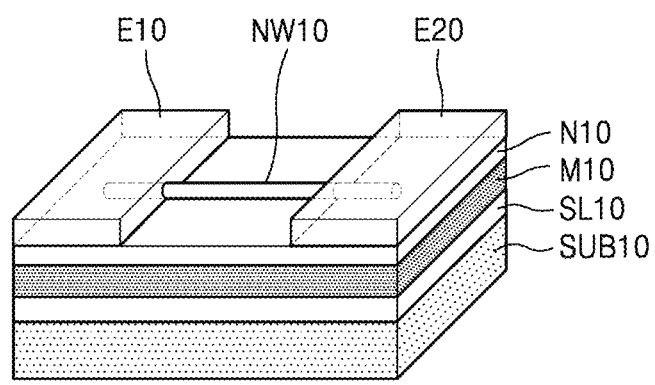

Referring to FIG. 20D, a device unit including the nanowire NW10 may be formed on the substrate SUB10. For example, first and second electrodes E10 and E20 contacting the nanowire NW10 may be formed on the insulating layer N10.

As illustrated in FIGS. 20A to 20D, when the substrate SUB10 is used as a starting material and the catalyst metal layer M10, the insulating layer N10, and the nanowire NW10 are formed thereon, a semiconductor device manufacturing process may be performed more easily. In particular, since the substrate attaching process illustrated in FIG. 16B (i.e., the process between FIGS. 16A and 16B) is not required and also the transfer process illustrated in FIGS. 18A to 18C is not required, the manufacturing process may be simplified and facilitated.

Figure 21:
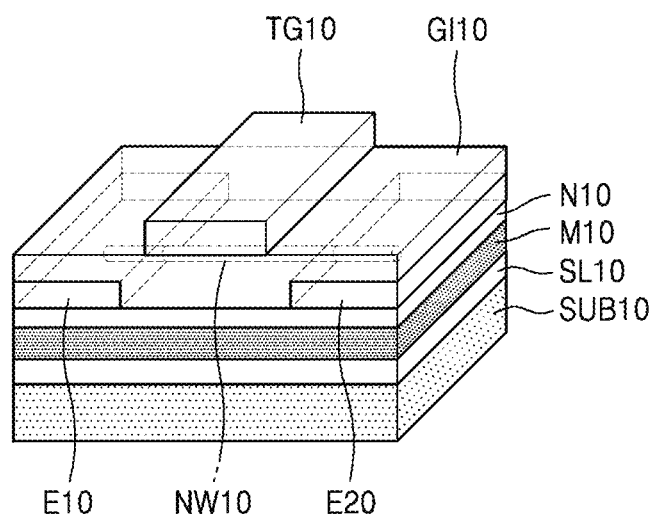
FIG. 21 is a perspective view illustrating a semiconductor device and a method of manufacturing the same according to another exemplary embodiment.

The structure of FIG. 20D may be the same as the structure of FIG. 16C. Thus, the application to various semiconductor devices illustrated in FIG. 16C may be similarly applied to FIG. 20D. Also, as illustrated in FIG. 21, a gate insulating layer GI10 and a top gate TG10 may be further formed on the structure of FIG. 20D. The structure of FIG. 21 may be the same as the structure of FIG. 17. Thus, the application to various semiconductor devices illustrated in FIG. 17 may be similarly applied to FIG. 21.

In the above exemplary embodiments, after the crystalline insulating layer N10 is formed on the catalyst metal layer M10, the semiconductor nanowire NW10 is formed thereon. However, according to another exemplary embodiment, a subsequent process may be performed after the preformed crystalline insulating layer N10 is formed on a substrate by a transfer process. An example thereof is illustrated in FIGS. 22A to 22D.

FIGS. 22A to 22D are perspective views illustrating a method of manufacturing a semiconductor device according to another exemplary embodiment.

Figure 22A:
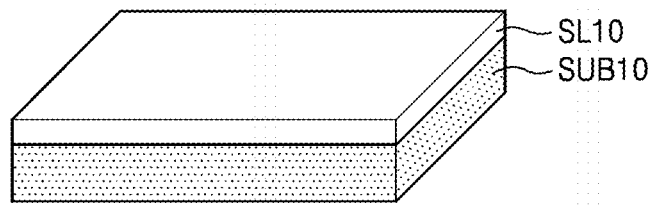
FIGS. 22A to 22D are perspective views illustrating a method of manufacturing a semiconductor device according to another exemplary embodiment.

Referring to FIG. 22A, a substrate SUB10 may be prepared. The substrate SUB10 may be a semiconductor substrate such as a silicon substrate. In this case, a surface insulating layer SL10, such as a silicon oxide layer, may be formed on a surface of the substrate SUB10. The combined substrate structure (i.e., SUB10 and SL10) of FIG. 22A may be the same as that of FIG. 20A.

Figure 22B:
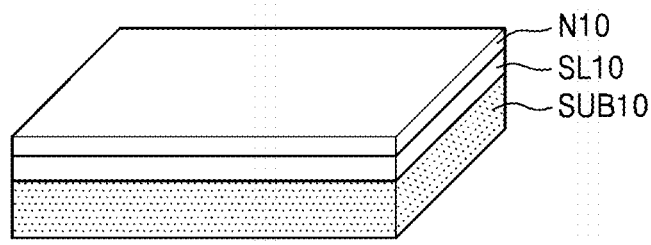

Referring to FIG. 22B, a crystalline insulating layer N10 may be formed on the substrate SUB10 by a transfer process. The insulating layer N10 may be attached to the surface insulating layer SL10. The insulating layer N10 may be formed on a catalyst metal layer in another substrate and then transferred from the other substrate onto the substrate SUB10. Since the process of transferring the insulating layer N10 may be similar to a well-known graphene transfer processes, detailed descriptions thereof are not included herein. However, in some cases, the insulating layer N10 may be formed on the surface insulating layer SL10 of the substrate SUB10 by a process other than a transfer process. For example, the insulating layer N10 may be formed by a deposition process.

Figure 22C:
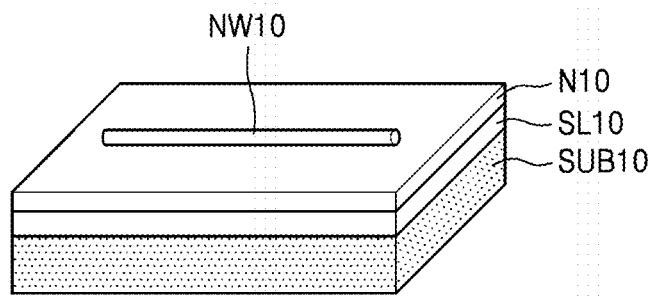

Referring to FIG. 22C, a semiconductor nanowire NW10 may be directly formed on the crystalline insulating layer N10 by a growth process. The method of forming the nanowire NW10 may be the same as described with reference to, for example, FIG. 1B.

Figure 22D:
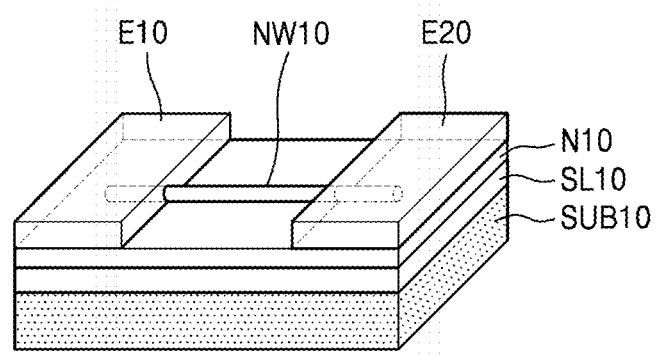

Referring to FIG. 22D, a device unit including the nanowire NW10 may be formed on the substrate SUB10. For example, first and second electrodes E10 and E20 contacting the nanowire NW10 may be formed on the insulating layer N10.

Figure 23:
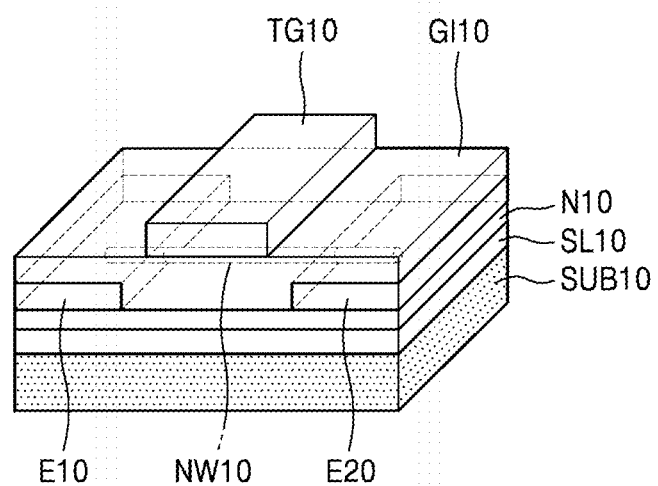
FIG. 23 is a perspective view illustrating a semiconductor device and a method of manufacturing the same according to another exemplary embodiment.

The structure of FIG. 22D may be the same as the structure of FIG. 18D. Thus, the application to various semiconductor devices illustrated in FIG. 18D may be similarly applied to FIG. 22D. Also, as illustrated in FIG. 23, a gate insulating layer GI10 and a top gate TG10 may be further formed on the structure of FIG. 22D. The structure of FIG. 23 may be the same as the structure of FIG. 19. Thus, the application to various semiconductor devices illustrated in FIG. 19 may be similarly applied to FIG. 23.

In the above exemplary embodiment, an anti-oxidation layer (not illustrated) for preventing the oxidation of the nanowire NW10 may be further provided if necessary. For example, an anti-oxidation layer may be provided to cover the nanowire NW10 in the structure of FIG. 14B, and an anti-oxidation layer may also be provided between the nanowire NW10 and the gate insulating layer GI10 in the structure of FIG. 15. When the diameter/thickness of the nanowire NW10 is greater than the thickness of an oxide layer that may be naturally generated, the anti-oxidation layer may not be formed. In this case, even when an oxide layer is formed at a surface portion of the nanowire NW10, since an inside thereof (i.e., a core portion) may be maintained in a non-oxidized state, it may be used as a semiconductor element. When the diameter/thickness of the nanowire NW10 is very small, about 3 nm or less, the anti-oxidation layer may be formed to prevent the oxidation of the entire nanowire NW10. In some cases, the oxidation of the nanowire NW10 may be prevented by adjusting the process conditions (e.g., the gas atmosphere) instead of by forming an anti-oxidation layer.

In the above exemplary embodiments of FIGS. 14A to 23, the nanowire NW10 may be in an undoped state or may have a doped structure.

FIGS. 24A, 24B, 24C and 24D are perspective views illustrating various doped structures of a nanostructure (nanowire) that may be applied to a semiconductor device according to exemplary embodiments.

Figure 24A:
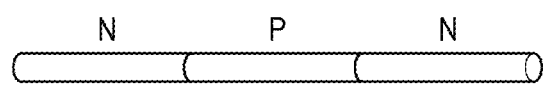
FIGS. 24A, 24B, 24C and 24D are perspective views illustrating various doped structures of a nanostructure (nanowire) that may be applied to a semiconductor device according to exemplary embodiments.
Figure 24B:
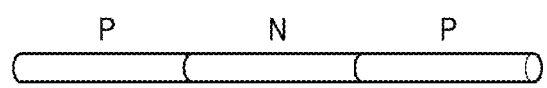
Figure 24C:
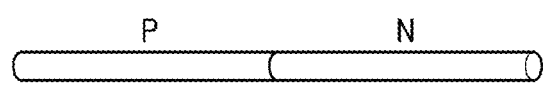
Figure 24D:
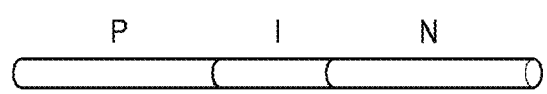

FIG. 24A illustrates a nanowire having an NPN structure. FIG. 24B illustrates a nanowire having a PNP structure. FIG. 24C illustrates a nanowire having a PN structure. FIG. 24D illustrates a nanowire having a PIN structure. For example, when a nanowire having the NPN structure of FIG. 24A or a nanowire having the PNP structure of FIG. 24B is used as the nanowire NW10 in FIG. 15, the device of FIG. 15 may operate as a P-channel MOSFET or an N-channel MOSFET. When the structure of FIG. 14B is used as an optical device or a diode, the PN structure of FIG. 24C or the PIN structure of FIG. 24D may be applied to the nanowire NW10. The various doped structures in FIGS. 24A, 24B, 24C and 24D may be applied not only to FIGS. 14B and 15 but also to, for example, FIGS. 16C, 17, 18D, 19, 20D, 21, 22D, and 23. An N-type dopant material may include any one of general N-type dopant materials, such as nitrogen (N) and phosphorus (P), and a P-type dopant material may include any one of general P-type dopant materials such as boron (B) and aluminum (Al). Also, the process of forming a P-type doped region and a P-type doped in the nanowire may be easily performed using a general semiconductor doping process. For example, a nanowire NW10 having an NPN structure may be obtained by doping the entire nanowire NW10 with an N-type dopant in the operation of FIG. 16B and then doping a center portion of the nanowire NW10, which is exposed between the first and second electrodes E10 and E20, with a P-type dopant in the operation of FIG. 16C. However, this method is merely exemplary and may vary according to various exemplary embodiments.

Figure 25A:
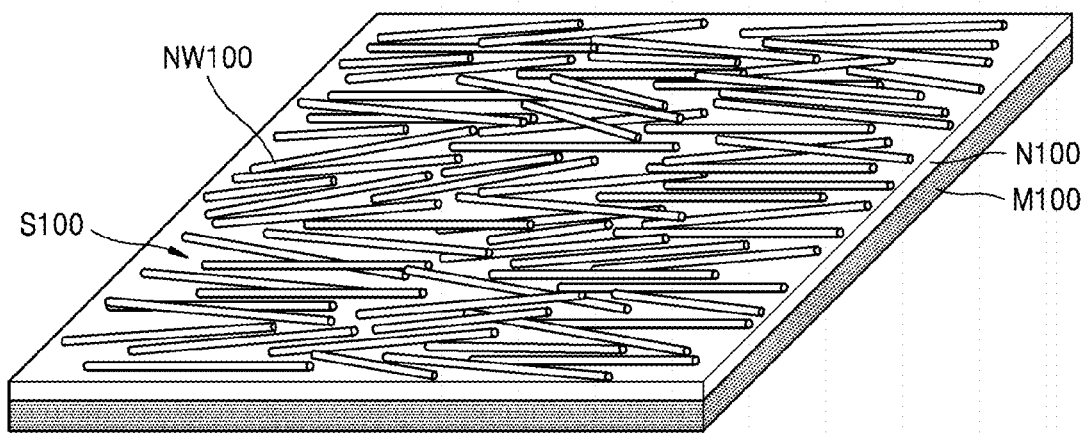
FIGS. 25A to 25C are perspective views illustrating a method of manufacturing a semiconductor device according to another exemplary embodiment.
Figure 25B:
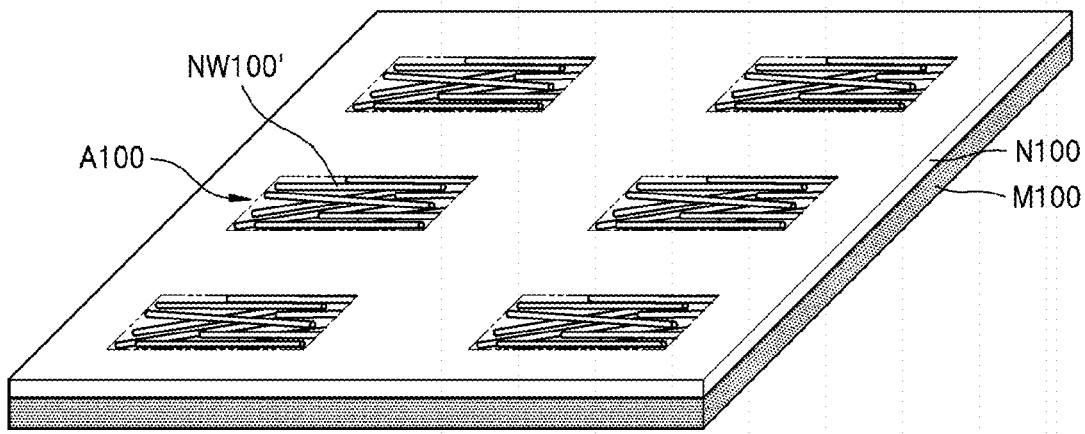
Figure 25C:
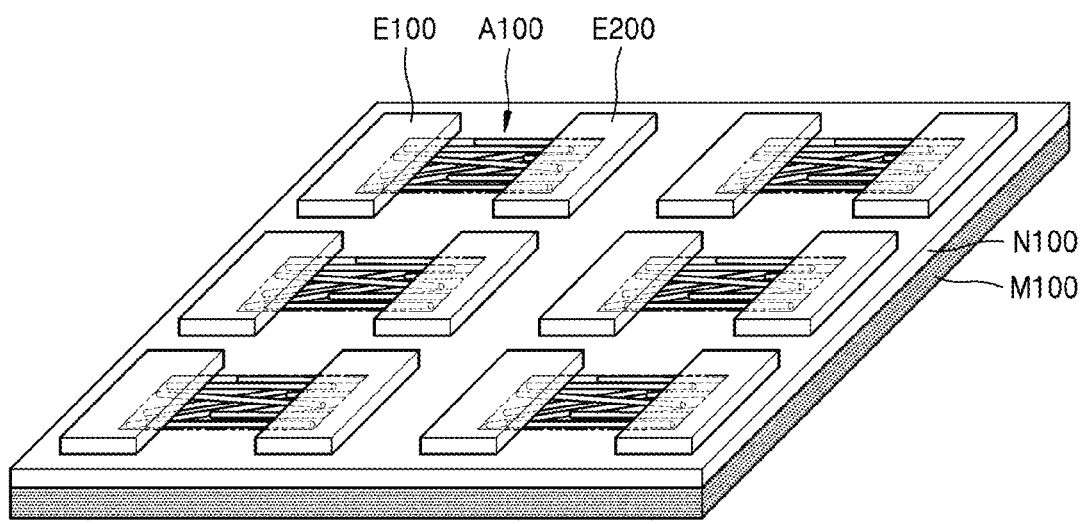

FIGS. 25A to 25C are perspective views illustrating a method of manufacturing a semiconductor device according to another exemplary embodiment.

Referring to FIG. 25A, an insulating layer N100 having a crystal structure may be formed on a catalyst metal layer M100. The catalyst metal layer M100 and the insulating layer N100 may correspond respectively to the catalyst metal layer M100 and the insulating layer N100 of FIG. 2A. The catalyst metal layer M100 may include, for example, Cu, Ni, Fe, Co, Pt, and/or Ru. The insulating layer N100 may include a crystalline insulating 2D material. The 2D material may be, for example, an h-BN.

Thereafter, a plurality of semiconductor nanowires (hereinafter referred to as nanowires) NW100 may be formed on the insulating layer N100. At least some of the nanowires NW100 may form a network structure. In other words, the nanowires NW100 may have a network structure. Each of the nanowires NW 100 may be referred to as a nanofiber, and in such a case, the nanowires NW 100 may be referred to as forming a nanofiber network structure. The formation method and/or materials of the nanowires NW100 may be similar or identical to those of the nanowire NW10 illustrated in, e.g., FIG. 2B. The nanowires NW100 may include, for example, at least one of Si, Ge, and SiGe. The nanowires NW100 may be referred to as constituting a semiconductor element layer S100. In other words, the semiconductor element layer S100 including the nanowires NW100 is formed on the insulating layer N100 in FIG. 25A. The semiconductor element layer S100 may be referred to as a nanostructure layer or a nanostructure.

Referring to FIG. 25B, the semiconductor element layer S100 may be patterned to form a plurality of active layer regions A100. The active layer regions A100 may be uniformly arranged so as to be spaced apart from each other. Each of the active layer regions A100 may include a plurality of nanowires NW100'. NW100' represents the nanowire after the patterning process.

Referring to FIG. 25C, a device unit corresponding to each of the active layer regions A100 may be formed on the insulating layer N100. For example, first and second electrodes E100 and E200 contacting each active layer region A100 may be formed. The first electrode E100 may contact a first region (e.g., a first end portion) of the active layer region A100, and the second electrode E200 may contact a second region (e.g., a second end portion) of the active layer region A100. The arrangement and shape of the first and second electrodes E100 and E200 presented herein are merely exemplary and may vary according to various exemplary embodiments.

Figure 26:
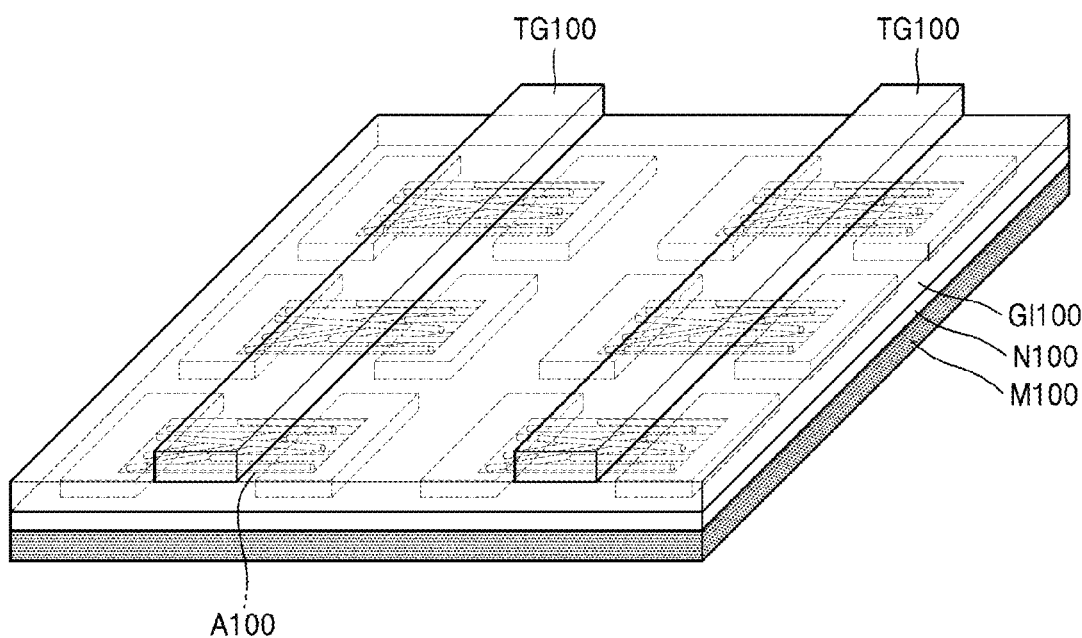
FIG. 26 is a perspective view illustrating a semiconductor device and a method of manufacturing the same according to another exemplary embodiment.

A top gate may be further formed on the device structure of FIG. 25C. An example thereof is illustrated in FIG. 26. Referring to FIG. 26, a gate insulating layer GI100 covering the active layer regions A100 and the first and second electrodes E100 and E200 may be formed on the insulating layer N100, and a plurality of top gates TG100 may be formed on the gate insulating layer GI100. The arrangement and shape of the top gates TG100 presented herein are merely exemplary and may vary according to various exemplary embodiments.

As described with reference to FIGS. 25A to 25C and 26, the exemplary embodiment may be easily applied to a large-area process (for example, a wafer-level process). Thus, the exemplary embodiment may be suitable as a commercialization process for mass production.

Figure 27:
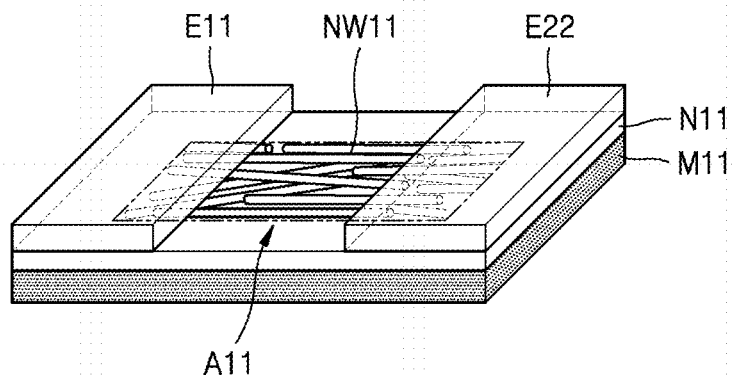
FIG. 27 is a perspective view illustrating a semiconductor device according to another exemplary embodiment.
Figure 28:
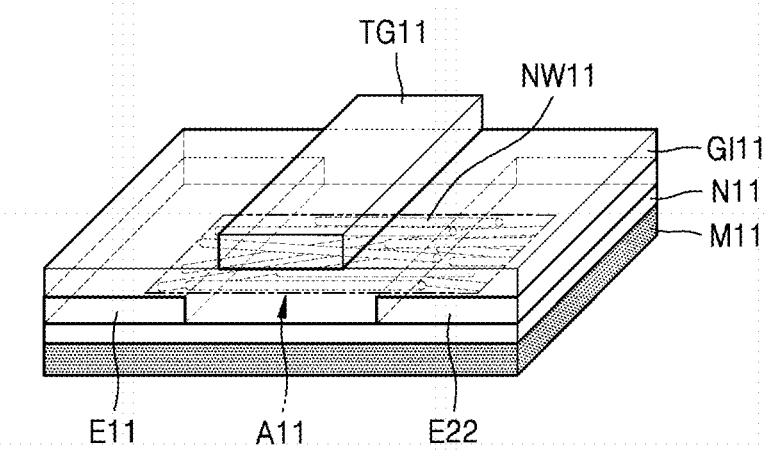
FIG. 28 is a perspective view illustrating a semiconductor device according to another exemplary embodiment.

FIG. 27 is a perspective view illustrating a structure corresponding to a unit device of FIG. 25C, and FIG. 28 is a perspective view illustrating a structure corresponding to a unit device of FIG. 26. Both the structures of FIGS. 27 and 28 may correspond to the semiconductor device according to the exemplary embodiments.

Referring to FIG. 27, a crystalline insulating layer N11 may be formed on a catalyst metal layer M11, and a plurality of nanowires NW11 may be formed on the insulating layer N11. At least some of the nanowires NW11 may form a network structure. The nanowires NW11 may be referred to as constituting an active layer region A11. First and second electrodes E11 and E22 respectively contacting the first and second regions may be provided.

Referring to FIG. 28, a gate insulating layer GI11 may be provided on the insulating layer N11 in the structure of FIG. 27, and a top gate TG11 may be provided on the gate insulating layer GI11.

In the structure of FIGS. 27 and 28, the insulating layer N11 may include an insulating 2D material such as an h-BN, and the nanowires NW11 may be directly deposited on the insulating layer N11. Thus, the nanowires NW11 may directly contact the insulating layer N11. The structure of FIGS. 27 and 28 may be used in various devices such as transistors, diodes, optical devices, and sensors.

The manufacturing methods and the semiconductor device structures described with reference to FIGS. 25A to 25C, 26, 27, and 28 may vary in various ways like the exemplary embodiments described with reference to, e.g., FIGS. 16A to 16C, 17, 18A to 18D, 19, 20A to 20D, 21, 22A to 22D, and 23.

The semiconductor device according to the above exemplary embodiments may replace any existing semiconductor device, such as a Si-based semiconductor device. The semiconductor device according to the exemplary embodiments may be implemented in chip form to be used in any application field of transistors or diodes, may be applied to portable phones or any home appliances, and may be applied to various fields such as optical devices and sensors. According to the exemplary embodiments, since the semiconductor nanowires NW10 and NW100 are directly grown on the crystalline insulating layers N10 and N100 and are used as the components of the semiconductor device, various relevant advantages may be obtained. In particular, since the nanowires NW10 and NW100 are directly formed on the insulating layers N10 and N100, a process of transferring the nanowires NW10 and NW100 may not be required. Also, since the crystalline insulating layers N10 and N100 are used, uniform and excellent device properties may be easily achieved. Thus, devices having excellent performance and uniformity may be achieved. In addition, since a large-area process may be possible, the inventive concept herein may be suitable for a commercialized process.

Although many details have been described above, they are not intended to limit the scope of the present disclosure, but should be interpreted as examples of the exemplary embodiments. For example, those of ordinary skill in the art will understand that the nanostructure forming methods described with reference to FIGS. 1A to 13 may vary according to various exemplary embodiments. Also, those of ordinary skill in the art will understand that the semiconductor device manufacturing methods and the semiconductor device structures described with reference to FIGS. 14A to 28 may vary according to various exemplary embodiments. In addition, those of ordinary skill in the art will understand that the application fields of the semiconductor device structures may vary according to various exemplary embodiments. Therefore, the scope of the present disclosure should be defined not by the described exemplary embodiments but by the technical spirit and scope described in the following claims.

It should be understood that exemplary embodiments described herein should be considered as being descriptive only and should not be considered limiting. Descriptions of features or aspects within each exemplary embodiment should typically be considered as being available for other similar features or aspects in other exemplary embodiments.

While exemplary embodiments have been described with reference to the figures, it will be understood by those of ordinary skill in the art that various changes in form and details may be made therein without departing from the spirit and scope as defined by the following claims.

What is claimed is:

1. A method of forming a nanostructure, the method comprising:
   forming an insulating layer having a crystal structure; and
   growing at least one semiconductor nanostructure on the insulating layer,
   wherein the nanostructure comprises a nanowire and the nanowire is formed by using an evaporation process.

2. The method of claim 1, wherein the insulating layer comprises an insulating two-dimensional (2D) material.

3. The method of claim 2, wherein the insulating 2D material comprises a hexagonal boron nitride (h-BN).

4. The method of claim 1, wherein the insulating layer is formed on a catalyst metal layer.

5. The method of claim 4, wherein the catalyst metal layer comprises at least one of copper (Cu), nickel (Ni), iron (Fe), cobalt (Co), platinum (Pt), and ruthenium (Ru).

6. The method of claim 1, wherein the nanostructure comprises at least one of silicon (Si), germanium (Ge), and SiGe.

7. The method of claim 1, wherein the nanowire is formed at a deposition substrate temperature of about 340° C. to about 420° C.

8. The method of claim 1, wherein the nanowire is formed by a deposition process performed for about 10 minutes to about 30 minutes.

9. The method of claim 1, wherein a plurality of nanowires form a network structure on the insulating layer.

10. A method of manufacturing a semiconductor device, the method comprising:
    forming an insulating layer having a crystal structure;
    growing at least one semiconductor nanostructure on the insulating layer; and
    forming a device unit comprising the semiconductor nanostructure,
    wherein the semiconductor nanostructure comprises a nanowire and the nanowire is formed by using an evaporation process.

11. The method of claim 10, wherein the insulating layer comprises an insulating two-dimensional (2D) material.

12. The method of claim 11, wherein the insulating 2D material comprises a hexagonal boron nitride (h-BN).

13. The method of claim 10, wherein the insulating layer is formed on a catalyst metal layer, and
    the catalyst metal layer comprises at least one of copper (Cu), nickel (Ni), iron (Fe), cobalt (Co), platinum (Pt), and ruthenium (Ru).

14. The method of claim 10, wherein the semiconductor nanostructure comprises at least one of silicon (Si), germanium (Ge), and SiGe.

15. The method of claim 10, wherein the nanowire is formed by using the evaporation process at a deposition substrate temperature of about 340° C. to about 420° C.

16. The method of claim 10, further comprising:
    forming the insulating layer on a catalyst metal layer;
    forming the nanowire on the insulating layer;
    attaching the catalyst metal layer having the insulating layer and the nanowire formed thereon to a surface of a substrate; and
    forming the device unit comprising the nanowire on the substrate.

17. The method of claim 10, further comprising:
    forming the insulating layer on a catalyst metal layer;
    forming the nanowire on the insulating layer;
    removing the catalyst metal layer from the insulating layer;
    attaching the insulating layer having the nanowire formed thereon to a surface of a substrate; and
    forming the device unit comprising the nanowire on the substrate.

18. The method of claim 10, further comprising:
    forming a catalyst metal layer on a substrate;
    forming the insulating layer on the catalyst metal layer;
    forming the nanowire on the insulating layer; and
    forming the device unit comprising the nanowire.

19. The method of claim 10, further comprising:
    forming the insulating layer on a substrate by a transfer process;
    forming the nanowire on the insulating layer; and
    forming the device unit comprising the nanowire.

20. The method of claim 10, wherein the forming of the device unit comprises:
    forming a first electrode contacting a first end portion of the nanowire; and
    forming a second electrode contacting a second end portion of the nanowire.

21. The method of claim 20, wherein the forming of the device unit further comprises forming a gate for applying an electric field to the nanowire.

22. The method of claim 20, further comprising forming a top gate on top of the nanowire.

23. The method of claim 10, wherein the nanowire has a structure selected from the group consisting of a PN structure, a PIN structure, an NPN structure, and a PNP structure.

24. The method of claim 10, further comprising:
    forming a semiconductor element layer comprising a plurality of nanowires on the insulating layer; and
    patterning the semiconductor element layer to form a plurality of active layer regions each having a network structure of nanowires,
    wherein the device unit is formed to correspond to each of the active layer regions.

25. A semiconductor device comprising:
    a two-dimensional (2D) insulating layer provided on a substrate, the 2D insulating layer comprising a crystalline insulating 2D material, the 2D insulating layer comprising a hexagonal boron nitride (h-BN);
    a semiconductor nanowire directly on the 2D insulating layer, the semiconductor nanowire comprising at least one of silicon (Si), germanium (Ge), and SiGe, the nanowire of Si, Ge or SiGe directly contacting the h-BN, and the semiconductor nanowire being disposed horizontally on a surface of the h-BN;

a first electrode contacting a first region of the semiconductor nanowire; and a second electrode contacting a second region of the semiconductor nanowire.

26. The semiconductor device of claim 25, further comprising a catalyst metal layer provided between the substrate and the 2D insulating layer, wherein the catalyst metal layer comprises at least one of copper (Cu), nickel (Ni), iron (Fe), cobalt (Co), platinum (Pt), and ruthenium (Ru).

27. The semiconductor device of claim 25, wherein at least a portion of the substrate is a bottom gate, or the semiconductor device comprises a catalyst metal layer between the substrate and the 2D insulating layer, and the catalyst metal layer is a bottom gate.

28. The semiconductor device of claim 25, further comprising a gate insulating layer and a top gate provided on the semiconductor nanowire.

29. The semiconductor device of claim 25, wherein the semiconductor nanowire has at least one structure selected from the group consisting of a PN structure, a PIN structure, an NPN structure, and a PNP structure.

30. The semiconductor device of claim 25, wherein an active layer region having a networked structure of nanowires is provided on the 2D insulating layer, at least some of the nanowires directly contacting each other to form the networked structure, the first electrode contacts a first region of the active layer region, and the second electrode contacts a second region of the active layer region.

31. The semiconductor device of claim 30, further comprising a gate for applying an electric field to the active layer region.

32. The semiconductor device of claim 25, wherein the semiconductor device is a transistor or a diode.

33. The semiconductor device of claim 25, wherein the semiconductor device is an optical device or a sensor.

* * * * *